(12) United States Patent
Liu

(10) Patent No.: US 12,501,775 B2
(45) Date of Patent: Dec. 16, 2025

(54) DISPLAY PANEL AND DISPLAY DEVICE

(71) Applicant: BOE TECHNOLOGY GROUP CO., LTD., Beijing (CN)

(72) Inventor: Hao Liu, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 403 days.

(21) Appl. No.: 18/252,670

(22) PCT Filed: Mar. 10, 2022

(86) PCT No.: PCT/CN2022/080218
§ 371 (c)(1),
(2) Date: May 11, 2023

(87) PCT Pub. No.: WO2023/168670
PCT Pub. Date: Sep. 14, 2023

(65) Prior Publication Data
US 2024/0349535 A1 Oct. 17, 2024

(51) Int. Cl.
H10K 59/12 (2023.01)
H10K 59/121 (2023.01)
H10K 59/124 (2023.01)

(52) U.S. Cl.
CPC ..... H10K 59/1213 (2023.02); H10K 59/1216 (2023.02); H10K 59/124 (2023.02)

(58) Field of Classification Search
CPC ............. H10K 59/1213; H10K 59/124; H10K 59/1216
USPC .......................................................... 257/71
See application file for complete search history.

(56) References Cited

U.S. PATENT DOCUMENTS

2017/0317155 A1 11/2017 Oh et al.
2017/0338252 A1 11/2017 Lee et al.
2021/0257581 A1 8/2021 Wang et al.

FOREIGN PATENT DOCUMENTS

| CN | 106298852 A | 1/2017 | |
|---|---|---|---|
| CN | 107403804 A | 11/2017 | |
| CN | 107452766 A | 12/2017 | |
| CN | 110085648 A | 8/2019 | |
| CN | 110112144 A | 8/2019 | |
| KR | 20190030840 A | * 3/2019 | ......... H01L 27/3262 |

(Continued)

Primary Examiner — Phuc T Dang
(74) Attorney, Agent, or Firm — XSENSUS LLP

(57) ABSTRACT

A display panel includes: a substrate; a first semiconductor layer including a first active layer pattern; a first gate conductive layer including a first capacitor electrode plate; a second gate conductive layer including a second capacitor electrode plate; a first source-drain conductive layer including a third capacitor electrode plate; and a second semiconductor layer including a second active layer pattern. Each of an orthographic projection of the first capacitor electrode plate on the substrate and an orthographic projection of the third capacitor electrode plate on the substrate at least partially overlaps with an orthographic projection of the second capacitor electrode plate on the substrate. The first capacitor electrode plate is electrically connected to the third capacitor electrode plate, and the first capacitor electrode plate, the second capacitor electrode plate and the third capacitor electrode plate constitute a storage capacitor.

20 Claims, 36 Drawing Sheets

(56) References Cited

FOREIGN PATENT DOCUMENTS

| KR | 20190065679 A | * | 6/2019 | ......... | H01L 27/3258 |
| WO | WO-2021227062 A1 | * | 11/2021 | ......... | H10K 59/8051 |

* cited by examiner

DISPLAY PANEL AND DISPLAY DEVICE

CROSS-REFERENCE TO RELATED APPLICATION

This application is a national phase entry under 35 USC 371 of International Patent Application No. PCT/CN2022/080218, filed on Mar. 10, 2022, which is incorporated herein by reference in its entirety.

TECHNICAL FIELD

The present disclosure relates to the field of display technologies, and in particular, to a display panel and a display device.

BACKGROUND

With the continuous development of display technologies, active matrix organic light-emitting diode (AMOLED) display devices have been widely used due to their characteristics such as full screen, narrow bezel, high resolution, curling wearing and foldable design.

The resolution of the display devices is one of the most important properties of the electrical devices. How to improve the resolution of the display devices so as to improve the display effect of the display devices and enhance the image quality of electronic products has been explored in the industry. Especially in virtual reality (VR) display devices, the demand for pixels per inch is high. Thus, how to achieve ultra-high pixels per inch so as to improve the resolution of VR display devices is an urgent problem to be solved at present.

SUMMARY

In an aspect, a display panel is provided. The display panel includes a pixel circuit, and the pixel circuit includes a first transistor, a storage capacitor, and a second transistor.

The display panel includes a substrate, and a first semiconductor layer, a first gate conductive layer, a second gate conductive layer, a first source-drain conductive layer and a second semiconductor layer that are arranged in a stack on the substrate in a direction away from the substrate.

The first semiconductor layer includes a first active layer pattern, the first gate conductive layer includes a first capacitor electrode plate, the second gate conductive layer includes a second capacitor electrode plate, the first source-drain conductive layer includes a third capacitor electrode plate, and the second semiconductor layer includes a second active layer pattern. The first active layer pattern and the first capacitor electrode plate are configured to form a source, a drain and a gate of the first transistor, and the second active layer pattern is configured to form a source and a drain of the second transistor.

Each of an orthographic projection of the first capacitor electrode plate on the substrate and an orthographic projection of the third capacitor electrode plate on the substrate at least overlaps with an orthographic projection of the second capacitor electrode plate on the substrate, the first capacitor electrode plate is electrically connected to the third capacitor electrode plate, and the first capacitor electrode plate, the second capacitor electrode plate and the third capacitor electrode plate constitute the storage capacitor.

In some embodiments, the second active layer pattern is electrically connected to the third capacitor electrode plate.

In some embodiments, the display panel further includes a third gate conductive layer disposed between the first source-drain conductive layer and the second semiconductor layer.

The third gate conductive layer includes a first gate conductive pattern and a first connection pattern. The first gate conductive pattern is configured to form a first gate of the second transistor. The second active layer pattern is electrically connected to the third capacitor electrode plate through the first connection pattern.

In some embodiments, the display panel further includes: a first interlayer dielectric layer, a second interlayer dielectric layer, a first planarization layer, and a second gate insulation layer. The first interlayer dielectric layer is disposed between the first gate conductive layer and the second gate conductive layer; the second interlayer dielectric layer is disposed between the second gate conductive layer and the first source-drain conductive layer; the first planarization layer is disposed between the first source-drain conductive layer and the third gate conductive layer; and the second gate insulating layer is disposed between the third gate conductive layer and the second semiconductor layer.

The display panel is provided therein with a first through hole, a second through hole and a third through hole; the first through hole penetrates through the first interlayer dielectric layer and the second interlayer dielectric layer, and the third capacitor electrode plate is electrically connected to the first capacitor electrode plate through the first through hole; the second through hole penetrates through the first planarization layer, and the first connection pattern is electrically connected to the third capacitor electrode plate through the second through hole; and the third through hole penetrates through the second gate insulating layer, and the second active layer pattern is electrically connected to the first connection pattern through the third through hole.

In some embodiments, orthogonal projections of at least two of the first through hole, the second through hole, and the third through hole on the substrate at least partially overlap.

In some embodiments, the display panel further includes a second source-drain conductive layer and a first electrode layer. The second source-drain conductive layer is disposed on a side of the second semiconductor layer away from the substrate, and the second source-drain conductive layer includes a second connection pattern. The first electrode layer is disposed on a side of the second source-drain conductive layer away from the substrate, and the first electrode layer includes a first electrode, and the first electrode is electrically connected to the second connection pattern.

The first source-drain conductive layer further includes a third connection pattern, and the third connection pattern is electrically connected to the second connection pattern and the second capacitor electrode plate.

In some embodiments, the display panel further includes a third gate conductive layer disposed between the first source-drain conductive layer and the second semiconductor layer. The third gate conductive layer includes a fourth connection pattern, and the third connection pattern is electrically connected to the second connection pattern through the fourth connection pattern.

In some embodiments, the display panel further includes a first gate insulating layer, a first interlayer dielectric layer, a second interlayer dielectric layer, a first planarization layer, a second gate insulating layer, a third interlayer dielectric layer, and a second planarization layer.

The first gate insulating layer is disposed between the first semiconductor layer and the first gate conductive layer; the first interlayer dielectric layer is disposed between the first gate conductive layer and the second gate conductive layer; the second interlayer dielectric layer is disposed between the second gate conductive layer and the first source-drain conductive layer; the first planarization layer is disposed between the first source-drain conductive layer and the third gate conductive layer; the second gate insulating layer is disposed between the third gate conductive layer and the second semiconductor layer; the third interlayer dielectric layer is disposed between the second semiconductor layer and the second source-drain conductive layer; and the second planarization layer is disposed between the second source-drain conductive layer and the first electrode layer.

The display panel is provided therein with a fourth through hole, a fifth through hole, a sixth through hole, a seventh through hole and an eighth through hole; the fourth through hole penetrates through the first gate insulating layer and the first interlayer dielectric layer, and the second capacitor electrode plate is electrically connected to the first active layer pattern through the fourth through hole; the fifth through hole penetrates through the second interlayer dielectric layer, and the third connection pattern is electrically connected to the second capacitor electrode plate through the fifth through hole; the sixth through hole penetrates through the first planarization layer, and the fourth connection pattern is electrically connected to the third connection pattern through the sixth through hole; the seventh through hole penetrates through the second gate insulating layer and the third interlayer dielectric layer, and the second connection pattern is electrically connected to the fourth connection pattern through the seventh through hole; and the eighth through hole penetrates through the second planarization layer, and the first electrode is electrically connected to the second connection pattern through the eighth through hole.

In some embodiments, orthogonal projections of at least two of the fourth through hole, the fifth through hole, the sixth through hole, the seventh through hole, and the eighth through hole on the substrate at least partially overlap.

In some embodiments, the second source-drain conductive layer further includes data signal lines; a data signal line is configured to transmit a data signal and a reference signal; the reference signal is configured to reset a gate of the first transistor; and the data signal line is electrically connected to the second active layer pattern.

In some embodiments, the pixel circuit further includes a third transistor. The first semiconductor layer further includes a third active layer pattern, the first gate conductive layer further includes a second gate conductive pattern, and the third active layer pattern and the second gate conductive pattern are configured to form a source, a drain, and a gate of the third transistor. The first source-drain conductive layer further includes power supply signal lines, and a power supply signal line is electrically connected to the third active layer pattern.

In some embodiments, the display panel includes a plurality of pixel circuits arranged in a plurality of rows along a first direction, the plurality of pixel circuits are divided into a plurality of pixel circuit groups, each pixel circuit group includes adjacent two rows of pixel circuits in a second direction, and the first direction and the second direction intersect. The power supply signal lines extend along the first direction, a power supply signal line is disposed between the two rows of pixel circuits of the pixel circuit group, and the two rows of pixel circuits of the pixel circuit group are electrically connected to the power supply signal line.

In some embodiments, in the two rows of pixel circuits of the pixel circuit group, two adjacent pixel circuits in the second direction are arranged in mirror symmetry with respect to the power supply signal line as a symmetry axis.

In some embodiments, the pixel circuit further includes a fourth transistor. The first semiconductor layer further includes a fourth active layer pattern, the first gate conductive layer further includes a third gate conductive pattern, and the fourth active layer pattern and the third gate conductive layer are configured to form a source, a drain and a gate of the fourth transistor. The second gate conductive layer further includes initialization signal lines, and an initialization signal line is electrically connected to the fourth active layer pattern.

In some embodiments, the display panel includes a plurality of pixel circuits arranged in a plurality of rows along a first direction, the plurality of pixel circuits are divided into a plurality of pixel circuit groups, each pixel circuit group includes adjacent two rows of pixel circuits in a second direction, and the first direction and the second direction intersect. The initialization signal lines extend along the first direction, an initialization signal line is disposed between two adjacent pixel circuit groups, and two rows of pixel circuits adjacent to the initialization signal line in the two adjacent pixel circuit groups are electrically connected to the initialization signal line.

In some embodiments, in the two rows of pixel circuits electrically connected to the initialization signal line, two adjacent pixel circuits in the second direction are arranged in mirror symmetry with respect to the initialization signal line as a symmetry axis.

In some embodiments, the pixel circuit further includes a third transistor. The first gate conductive layer includes a second gate conductive pattern and enable signal lines, the second gate conductive pattern is configured to form a gate of the third transistor, and an enable signal line is electrically connected to the second gate conductive pattern.

The display panel further includes a third gate conductive layer disposed between the first source-drain conductive layer and the second semiconductor layer, the third gate conductive layer includes a first gate conductive pattern and first scan signal lines, the first gate conductive pattern is configured to form a first gate of the second transistor, and a first scan signal line is electrically connected to the first gate conductive pattern.

An orthographic projection of the enable signal line on the substrate at least partially overlaps with an orthographic projection of the first scan signal line on the substrate.

In some embodiments, the display panel further includes a fourth gate conductive layer disposed on a side of the second semiconductor layer away from the substrate.

The fourth gate conductive layer includes a fourth gate conductive pattern and second scan signal lines. The fourth gate conductive pattern is configured to form a second gate of the second transistor, and an orthographic projection of the fourth gate conductive pattern on the substrate at least partially overlaps with an orthographic projection of the first gate conductive pattern on the substrate. A second scan signal line is electrically connected to the fourth gate conductive pattern, and an orthographic projection of the second scan signal line on the substrate at least partially overlaps with the orthographic projection of the first scan signal line on the substrate.

In some embodiments, an orthographic projection of the first capacitor electrode plate on the substrate at least partially overlaps with an orthographic projection of the second active layer pattern on the substrate.

In some embodiments, the display panel includes at least one buffer layer disposed between the first source-drain conductive layer and the second semiconductor layer.

In some embodiments, a material of the first semiconductor layer includes a low-temperature polysilicon semiconductor material; and a material of the second semiconductor layer includes an oxide semiconductor material.

In another aspect, a display device is provided. The display device includes the display panel according to any one of the above embodiments.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
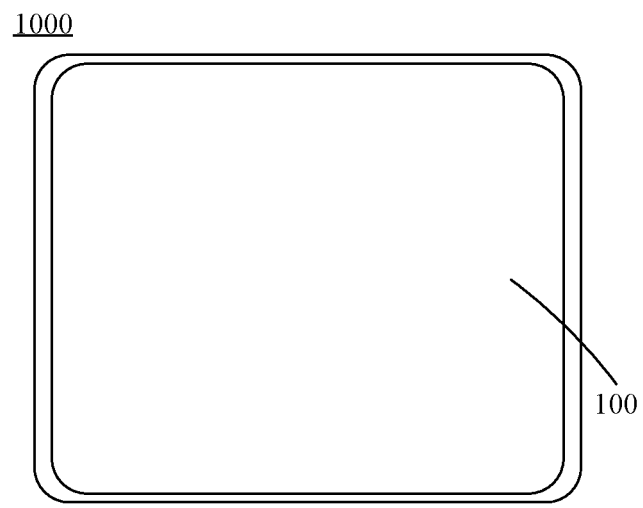
FIG. 1 is a top view of a display device, in accordance with some embodiments.

The technical solutions in the embodiments of the present disclosure will be described clearly and completely with reference to the accompanying drawings. However, the described embodiments are merely some but not all of embodiments of the present disclosure. All other embodiments obtained by a person having ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features Thus, a feature defined with the term such as "first" or "second" may explicitly or implicitly include one or more features. In the description of the embodiments of the present disclosure, the term "a plurality of" or "the plurality of" means two or more unless otherwise specified.

In the description of some embodiments, the expressions "electrically connected" and "connected" and derivatives thereof may be used. For example, the term "electrically connected" may be used in the description of some embodiments to indicate that two or more components are in direct physical contact or electrical contact with each other. The embodiments disclosed herein are not necessarily limited to the content herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

In the description of the present disclosure, it will be understood that, orientations or positional relationships indicated by the terms such as "center", "longitudinal", "transverse", "length", "width", "vertical", "horizontal", "inner", and "outer" are based on orientations or positional relationships shown in the drawings, which is merely for convenience in description of the present disclosure and simplifying the description, but not to indicate or imply that the indicated apparatus or element must have a specific orientation, or be constructed and operated in a specific orientation.

It will be understood that, in a case where a layer or element is referred to be on another layer or substrate, it may be that the layer or element is directly on the another layer or substrate, or it may be that there is intermediate layer(s) between the layer or element and the another layer or substrate.

Exemplary embodiments are described herein with reference to sectional views and/or plan views as idealized exemplary drawings. In the accompanying drawings, thicknesses of layers and areas of regions are enlarged for clarity. Variations in shape with respect to the accompanying drawings due to, for example, manufacturing technologies and/or tolerances may be envisaged. Therefore, the exemplary embodiments should not be construed as being limited to the shapes of the regions shown herein, but as including shape deviations due to, for example, manufacturing. For example, an etched region shown to have a rectangular shape generally has a feature of being curved. Thus, the regions shown in the accompanying drawings are schematic in nature, and their shapes are not intended to show actual shapes of regions in a device, and are not intended to limit the scope of the exemplary embodiments.

FIG. 1 is a top view of a display device 1000 provided in some embodiments of the present disclosure. The display device 1000 may be any device that displays images whether in motion (e.g., a video) or stationary (e.g., a static image), and whether textual or graphical. More specifically, it is contemplated that the embodiments may be implemented in or associated with various electronic devices. The various electronic devices include, for example, but are not limited to, mobile phones, wireless devices, personal digital assistants (PDAs), virtual reality (VR) displays, hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, auto displays (e.g., odometer displays, etc.), navigators, cockpit controls and/or displays, displays of camera views (e.g., displays of rear view cameras in vehicles), electronic photographs, electronic billboards or signs, projectors, architectural structures, and packaging and aesthetic structures (e.g., displays for images of a piece of jewelry).

The display device 1000 includes a display panel 100. The display panel 100 may be an organic light-emitting diode (OLED) display panel.

For example, the display device 1000 may further include a display driver chip and a flexible printed circuit board.

The display panel 100 has a light exit side and a backlight side, the light exit side refers to a side of the display panel 100 for displaying images, and the backlight side refers to a side of the display panel 100 facing away from the light exit side.

The display driver chip is located on the backlight side of the display panel 100, and is electrically connected to the display panel 100. The flexible printed circuit board is located on the backlight side of the display panel 100, and is electrically connected to the display panel 100. The display driver chip and the flexible printed circuit board are configured to provide data signals required for displaying images to the display panel 100.

For example, the display device 1000 may further include a housing.

Figure 2:
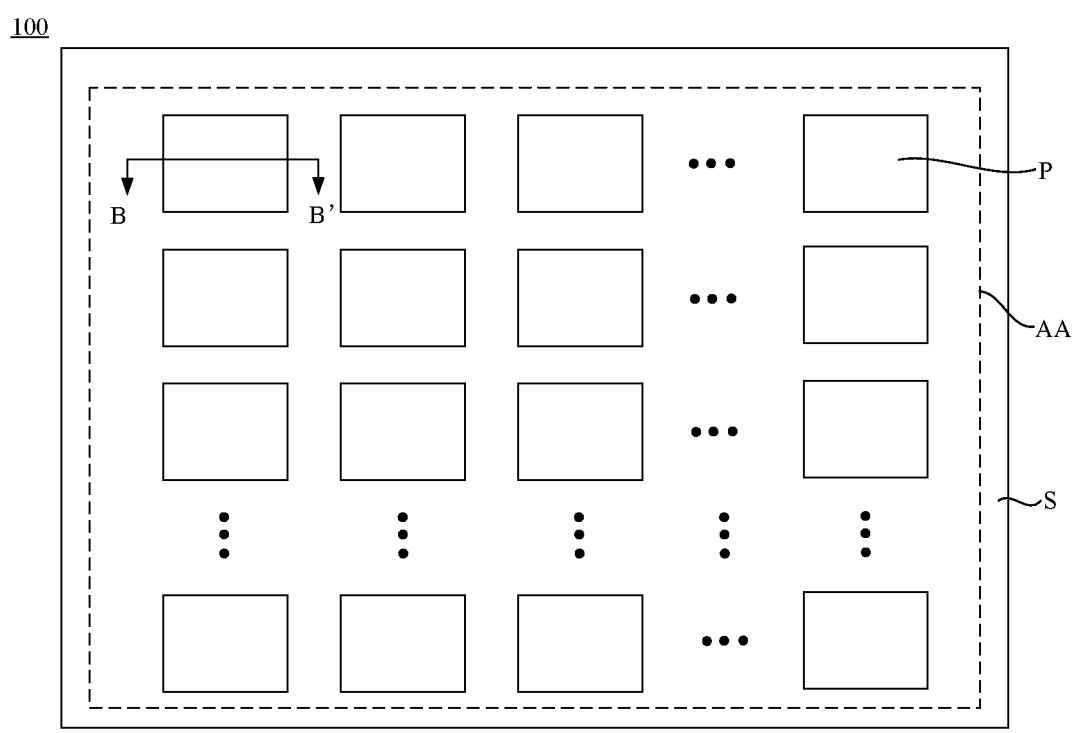
FIG. 2 is a top view of a display panel, in accordance with some embodiments.

FIG. 2 shows a top view of the display panel 100. As shown in FIG. 2, the display panel 100 has a display region (active area, abbreviated as AA region) and a peripheral area S.

The peripheral region S is located on at least one side of the AA region. For example, the peripheral region S may be arranged around the AA region.

As shown in FIG. 2, the display panel 100 includes a plurality of sub-pixels P, and the plurality of sub-pixels P are located in the AA region.

The plurality of sub-pixels P include at least sub-pixels capable of displaying a first color, sub-pixels capable of displaying a second color, and sub-pixels capable of displaying a third color; and the first color, the second color and the third color are three primary colors (e.g., red, green, and blue).

For example, the arrangement of the plurality of sub-pixels P varies. For example, the plurality of sub-pixels P are arranged in a diamond pattern, a matrix, or a "GGRB" arrangement.

In the plurality of sub-pixels P that are arranged in the diamond pattern, a connecting line of four sub-pixels, which are a sub-pixel P for displaying the first color, a sub-pixel P for displaying the second color and two sub-pixels P for displaying the third color, is in a shape of a diamond. The two sub-pixels P for displaying the third color are respectively located on two sides of a connecting line of the sub-pixel P for displaying the first color and the sub-pixel P for displaying the second color.

In the plurality of sub-pixels P arranged in the matrix, the sub-pixels P for displaying the first color, the sub-pixels P for displaying the second color, and the sub-pixels P for displaying the third color are arranged in an array along a row direction and a column direction.

In the plurality of sub-pixels P arranged in the "GGRB" arrangement, two sub-pixels P for displaying the third color constitute a sub-pixel group; the sub-pixel group and a sub-pixel P for displaying the first color and a sub-pixel P for displaying the second color are sequentially and alternately arranged along the row direction, so as to form a sub-pixel row; and sub-pixel rows are arranged in a plurality of rows along the column direction, and sub-pixels P of two adjacent sub-pixel rows are staggered in the column direction.

The row direction and the column direction intersect. For example, the row direction and the column direction are perpendicular to each other.

For convenience of description, the following is described by taking an example in which the plurality of sub-pixels P are arranged in the matrix.

Figure 3:
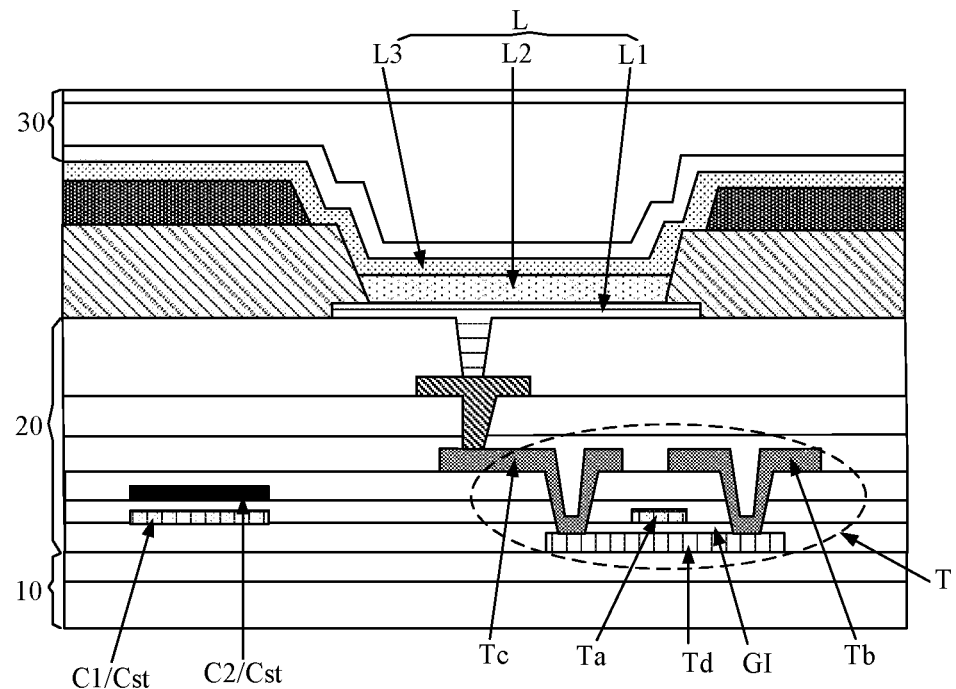
FIG. 3 is a sectional view taken along the section line B-B' in FIG. 2.

In the display panel 100, each sub-pixel P includes a pixel circuit 20 and a light-emitting device L (see FIG. 3).

FIG. 3 shows a sectional view of the display panel 100. As shown in FIG. 3, the display panel 100 includes a substrate 10, pixel circuits 20 disposed on the substrate 10, and light-emitting devices L disposed on a side of the pixel circuits 20 away from the substrate 10. The pixel circuit 20 is electrically connected to a corresponding light-emitting device L, and the pixel circuit 20 is used to drive the light-emitting device L to operate.

Referring to FIG. 3, the pixel circuit 20 includes a plurality of thin film transistors T and a plurality of capacitor structures Cst. Only one of the thin film transistors T and one of the capacitor structures Cst are exemplarily illustrated in FIG. 3.

The thin film transistor T includes a gate Ta, a source Tb, a drain Tc and an active layer pattern Td. The source Tb and the drain Tc are in electrical contact with the active layer pattern Td.

The active layer pattern Td is configured to, under control of the gate Ta, form a channel, which conducts the source Tb and the drain Tc that are connected to the active layer pattern Td, so that the thin film transistor T is turned on. For example, the thin film transistor T further includes a gate insulating layer GI located between a film layer where the gate Ta is located and a film layer where the active layer pattern Td is located.

It should be noted that, a control electrode of each thin film transistor T used in the pixel circuit 20 is a gate Ta of the transistor, a first electrode of each thin film transistor T is one of a source Tb and a drain Tc of the thin film transistor T, and a second electrode of each thin film transistor T is the other one of the source Tb and the drain Tc of the thin film transistor T. Since the source Tb and the drain Tc of the thin film transistor T may be symmetrical in structure, there may be no difference in structure between the source Tb and the drain Tc.

The capacitor structure Cst may include two electrode plates, for example, a first capacitor electrode plate C1 and a second capacitor electrode plate C2.

Referring to FIG. 3, the light-emitting device L includes a first electrode L1, a light-emitting pattern L2, and a second electrode L3. The first electrode L1 is electrically connected to the source Tb or the drain Tc of the thin film transistor T. only the electrical connection between the first electrode L1 and the drain Tc of the thin film transistor T is illustrated in FIG. 3.

For example, as shown in FIG. 3, the display panel 100 further includes an encapsulation layer 30 disposed on a side of the light-emitting devices L away from the substrate 10. The encapsulation layer 30 is configured to block external water vapour and oxygen, thereby preventing the devices (e.g., the light-emitting devices L) of the display panel 100 from being damaged.

The basic structure of the display panel 100 is described above, and the light-emitting process of the display panel 100 will be described below.

The circuit structure of the pixel circuit 20 of the display panel 100 may be implemented in various ways. For example, the pixel circuit 20 adopts a 7T1C structure (i.e., a single pixel circuit 20 includes 7 thin film transistors T and 1 capacitor structure Cst), a 3T2C structure (i.e., a single pixel circuit 20 includes 3 thin film transistors T and 2 capacitor structures Cst), or a 4T2C structure (i.e., a single pixel circuit 20 includes 4 thin film transistors T and 2 capacitor structures Cst), which is not limited in the embodiments of the present disclosure.

Figure 4:
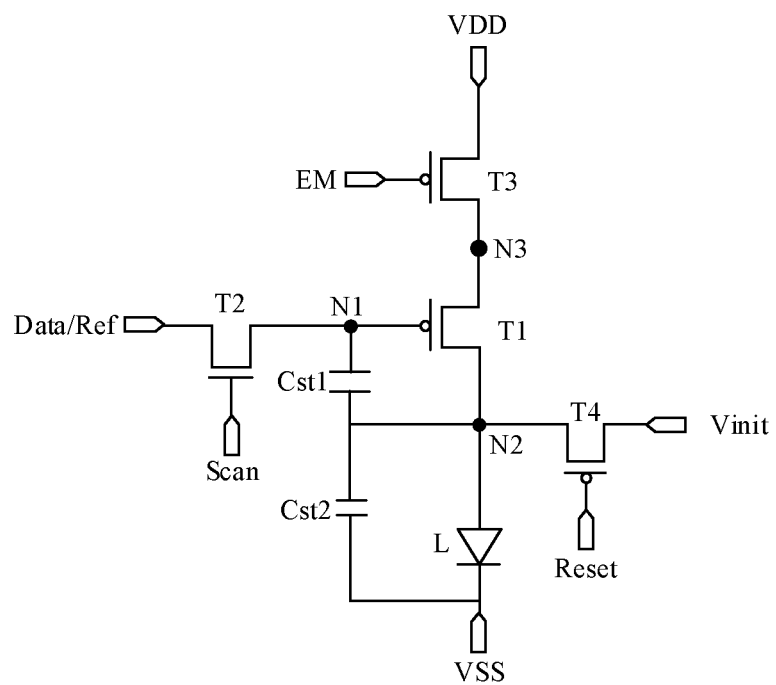
FIG. 4 is an equivalent circuit diagram of a pixel circuit, in accordance with some embodiments.

FIG. 4 shows a circuit structure of the pixel circuit 20. As shown in FIG. 4, in some embodiments, the pixel circuit 20 adopts a 4T2C structure (i.e., a single pixel circuit 20 includes 4 thin film transistors T and 2 capacitor structures Cst).

As shown in FIG. 4, the pixel circuit 20 includes four thin film transistors T, and the thin film transistors T are a first transistor T1, a second transistor T2, a third transistor T3, and a fourth transistor T4; and the pixel circuit 20 further includes two capacitor structures Cst, and the two capacitor structures Cst are a storage capacitor Cst1 and a parasitic capacitor Cst2.

It should be noted that, the parasitic capacitor Cst2 is not a conventionally designed capacitor, and is a structure of a parasitic capacitance generated between structures of the pixel circuit 20 due to mutual capacitance.

The first transistor T1 is a driving transistor, the second transistor T2 is an input transistor, and the second transistor T2 is used to input a data signal and a reference signal. The data signal and the reference signal are alternately transmitted. The third transistor T3 is a light-emitting control transistor for controlling the light-emitting device L to emit light. The fourth transistor T4 is a reset transistor for resetting the light-emitting device L.

In some embodiments, the first transistor T1, the third transistor T3 and the fourth transistor T4 are P-type transistors, so that these thin film transistors T each have a high mobility and a stable source voltage, and are suitable for driving the light-emitting device L. The second transistor T2 is an N-type transistor, so that the reset transistor (i.e., the fourth transistor T4) has a low leakage current, and a voltage of the driving transistor (i.e., the first transistor T1) and a voltage of the storage capacitor Cst1 may be kept stable.

It should be noted that, in the circuit shown in FIG. 4, nodes N1, N2 and N3 do not represent actual components, but represent junction points of related electrical connections in a circuit diagram. That is, these nodes are nodes equivalent to the junction points of the related electrical connections in the circuit diagram.

Figure 5:
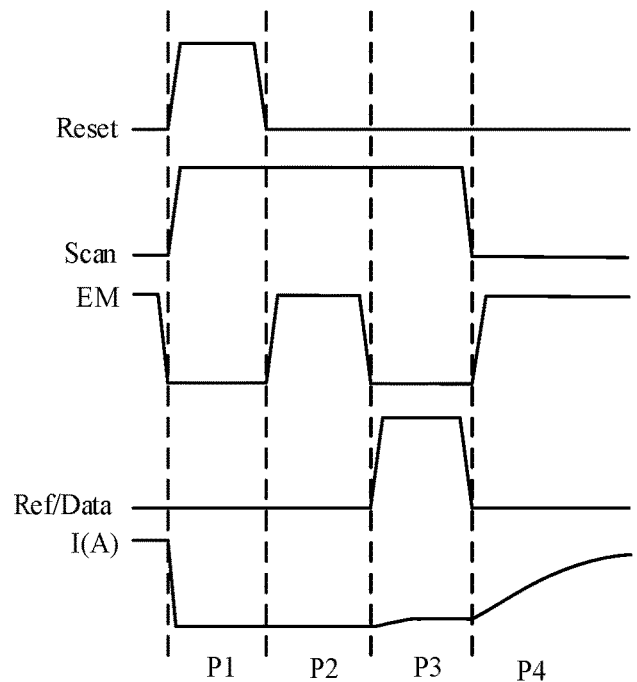
FIG. 5 is a timing diagram of a pixel circuit, in accordance with some embodiments.

As shown in FIG. 5, a process of driving, by the pixel circuit 20, the light-emitting device L to emit light is as follows.

A frame cycle includes a reset phase P1, a power supply voltage compensation phase P2, a sampling phase P3, and a light-emitting phase P4.

In the reset phase P1, under control of the reset signal Reset, the reset transistor (i.e., the fourth transistor T4) is turned on, transmits an initialization signal Vinit to the light-emitting device L to reset the light-emitting device L, and transmits the initialization signal Vinit to a second node N2. Meanwhile, under control of a scan signal Scan, the input transistor (i.e., the second transistor T2) is turned on and transmits a reference signal Ref to a first node N1 to reset the first node N1.

In the power supply voltage compensation phase P2, under control of an enable signal EM, the light-emitting control transistor (i.e., the third transistor T3) is turned on and transmits a power supply voltage signal VDD to a third node N3.

In the sampling phase P3, under control of the scan signal Scan, the input transistor (i.e., the second transistor T2) is turned on and transmits the data signal Data to the first node N1, so that a voltage of the first node N1 is increased. Meanwhile, the storage capacitor Cst1 is charged due to voltages of the first node N1 and the second node N2.

In the light-emitting phase P4, under control of the voltage of the first node N1, the driving transistor (i.e., the first transistor T1) is turned on and transmits the power supply voltage signal VDD from the third node N3 to the light-emitting device L. The light-emitting device L emits light due to the power supply voltage signal VDD and a cathode voltage signal VSS.

The higher the resolution of the display device 1000, the richer the details of the displayed image. Therefore, with the continuous development of the display technology, the demand for the high-resolution display device 1000 is increasing.

Under the condition of the same pixels per inch, the smaller the display screen, the smaller the resolution of the display device 1000. Therefore, for a small screen display device 1000 such as a VR, in order to improve resolution, realize fine display of images, and improve image fidelity, the higher the pixels per inch of the display device 1000, the better.

In the related art, a space occupied by a single sub-pixel P is reduced by compressing the sub-pixel P, thereby saving design space to arrange more sub-pixels P. Therefore, the number of sub-pixels P per unit area is increased, that is, the pixels per inch is improved. As a result, the resolution of the display device 1000 is improved.

However, in the process of compressing the sub-pixel P, sizes of structural components of the sub-pixel P need to be compressed, which may cause performances of the structural components of the sub-pixel P to be greatly affected. For example, after a size of the capacitor structure Cst is compressed, areas of the electrode plates (C1 and C2) of the capacitor structure Cst are reduced, which affects amount of charges stored in the capacitor structure Cst, and in turn affects the performance of the sub-pixel P. In addition, the process of compressing the sub-pixel P is difficult and even possible to achieve. For example, after a size of an aperture of a through hole in the sub-pixel P is compressed, during the deposition of a conductive material, it is easy to cause the conductive material to not be fully deposited in the through hole with a small aperture. As a result, the electrical connection of the pixel circuit 20 may be disconnected, which seriously affects the display effect of the display device 1000.

Figure 6:
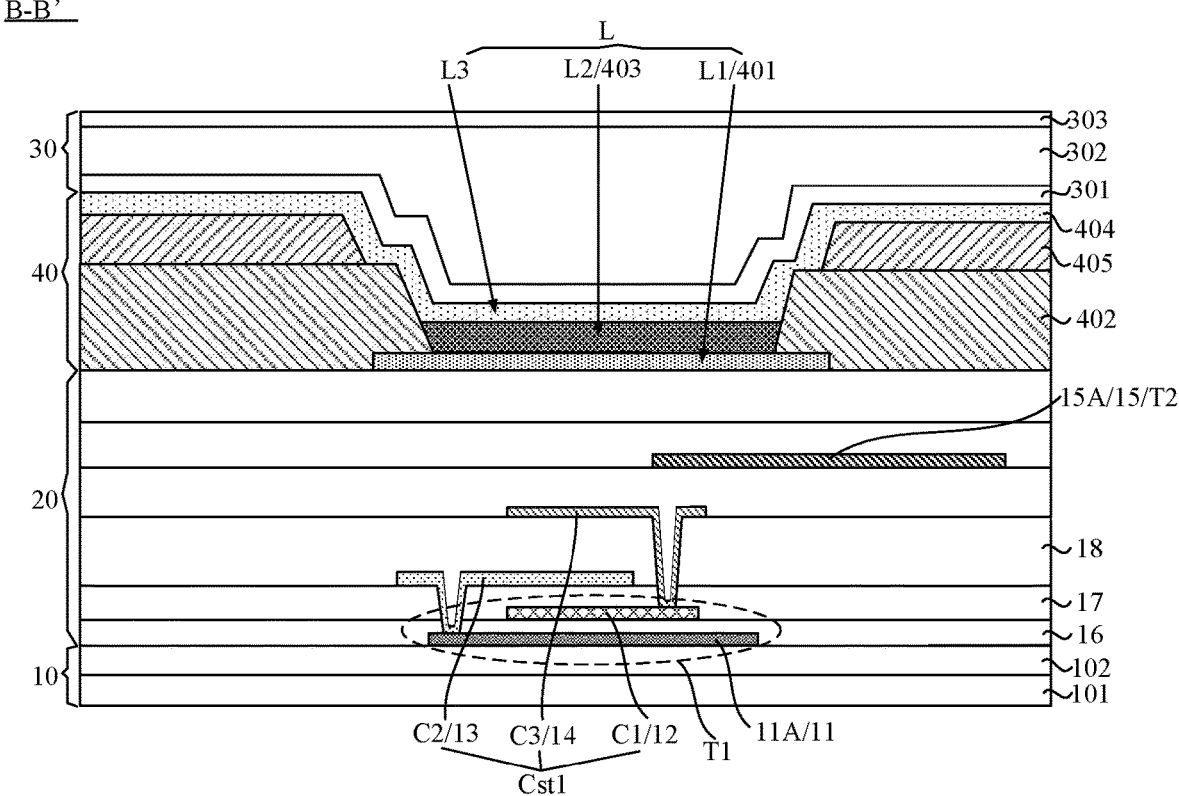
FIG. 6 is another sectional view taken along the section line B-B' in FIG. 2.

In order to solve the above technical problems, some embodiments of the present disclosure provide a display panel 100. As shown in FIG. 6, the display panel 100 includes at least the first transistor T1, the second transistor T2, and the storage capacitor Cst1.

The display panel 100 includes film layers that have patterns and are arranged in stack, so as to form the thin film transistors T, the capacitor structures Cst, and the light-emitting device L corresponding to the pixel circuit 20 in the equivalent circuit shown in FIG. 4.

As shown in FIGS. 6 and 7 to 16, the display panel 100 includes a substrate 10, and a first semiconductor layer 11, a first gate conductive layer 12, a second gate conductive layer 13, a first source-drain conductive layer 14, and a second semiconductor layer 15 that are arranged in a stack on the substrate 10 in a direction away from the substrate 10.

The substrate 10 may be of a single-layer structure or a multi-layer structure. For example, as shown in FIG. 6, the substrate 10 may include a flexible base layer 101 and a buffer layer 102 that are sequentially stacked. For another example, the substrate 10 may include a plurality of flexible base layers 101 and a plurality of buffer layers 102 that are alternately arranged. A material of the flexible base layer 101 may include polyimide. A material of the buffer layer 102 may include silicon nitride and/or silicon oxide, so as to achieve an effect of blocking moisture, oxygen and alkaline ions.

As shown in FIG. 6, the first semiconductor layer 11 is disposed on a side of the substrate 10. Optionally, a material of the first semiconductor layer 11 includes a low-temperature polysilicon semiconductor material.

Figure 7:
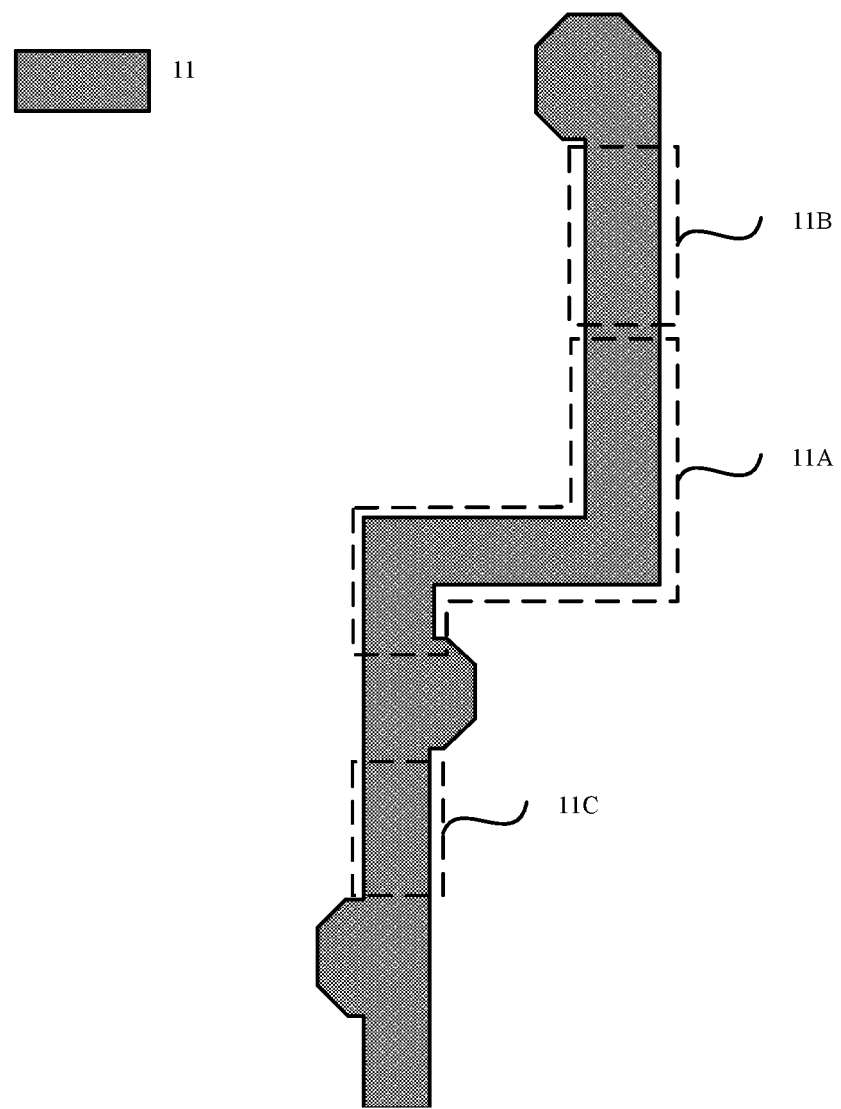
FIG. 7 is a structural diagram of a first semiconductor layer, in accordance with some embodiments.

As shown in FIG. 7, the first semiconductor layer 11 includes a first active layer pattern 11A, and the first active layer pattern 11A is configured to form a source and a drain of the first transistor T1.

It should be noted that the above-mentioned "the first active layer pattern 11A is configured to form a source and a drain of the first transistor T1" may include that two opposite ends of the first active layer pattern 11A are used as the source and the drain of the first transistor T1, respectively.

For example, the first active layer pattern 11A further includes a channel region located between the source and the drain. The channel region is configured to form a channel under control of a gate of the first transistor T1, so that the source and the drain of the first transistor T1 are communicated, that is, the first transistor T1 is turned on.

As shown in FIG. 6, the first gate conductive layer 12 is disposed on a side of the first semiconductor layer 11 away from the substrate 10.

Figure 8:
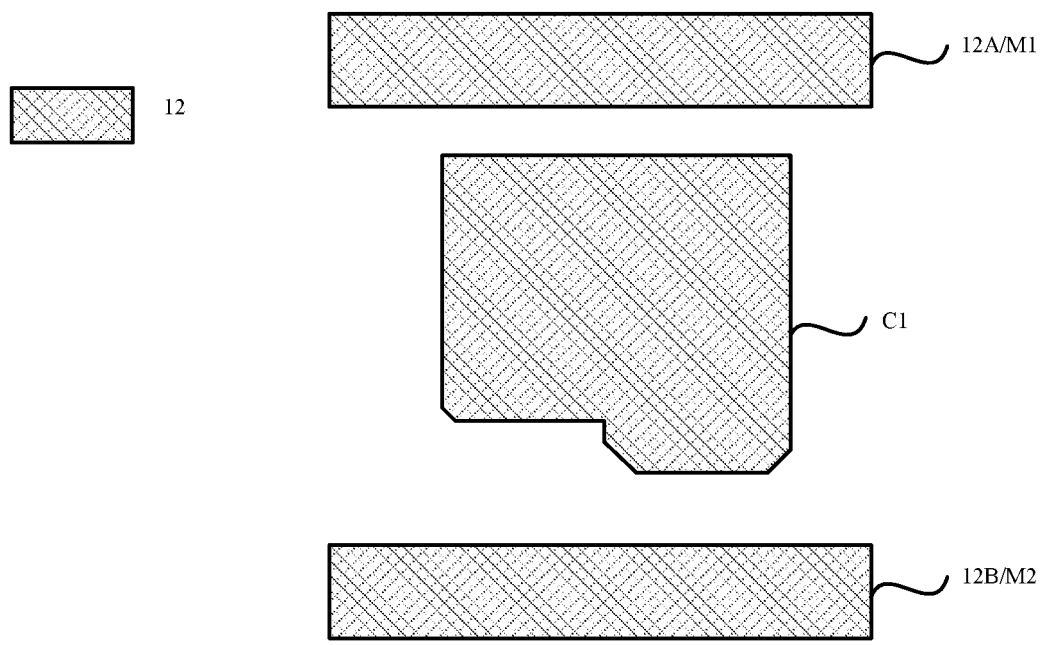
FIG. 8 is a structural diagram of a first gate conductive layer, in accordance with some embodiments.

As shown in FIG. 8, the first gate conductive layer 12 includes a first capacitor electrode plate C1. The first capacitor electrode plate C1 is configured to be used as an electrode plate of the storage capacitor Cst1.

Figure 9:
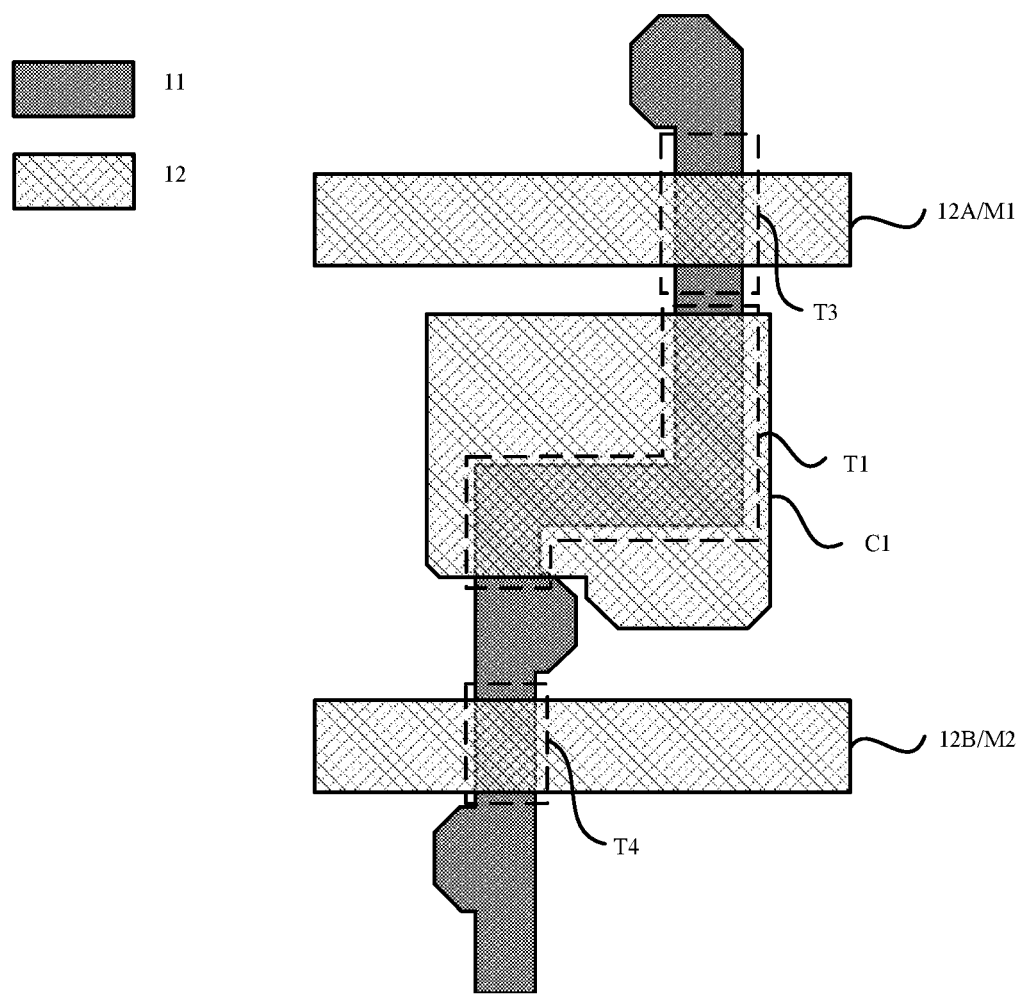
FIG. 9 is a diagram showing a structure where a first gate conductive layer has been stacked on a first semiconductor layer.

In addition, the first capacitor electrode plate C1 is further configured to form the gate of the first transistor T1. For example, as shown in FIG. 9, an orthographic projection of the first capacitor electrode plate C1 on the substrate 10 at least partially overlaps with an orthographic projection of the first active layer pattern 11A on the substrate 10. A portion of the first capacitor electrode plate C1 overlapping the first active layer pattern 11A is used as the gate of the first transistor T1.

For example, the display panel 100 further includes a first gate insulating layer 16. As shown in FIG. 6, the first gate insulating layer 16 is disposed between the first semiconductor layer 11 and the first gate conductive layer 12.

As shown in FIG. 6, the second gate conductive layer 13 is disposed on a side of the first gate conductive layer 12 away from the substrate 10.

Figure 11:
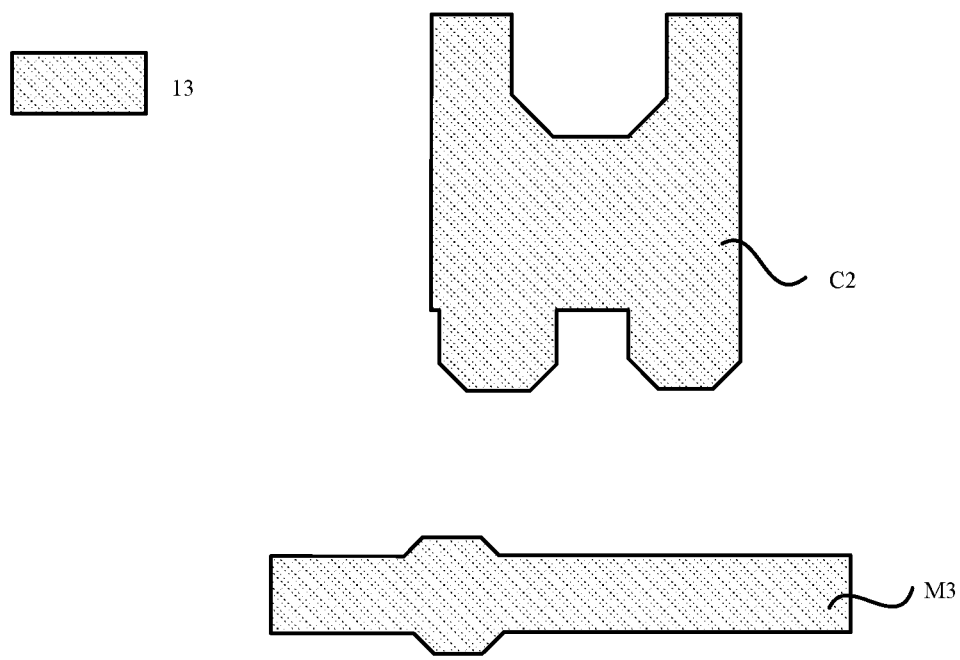
FIG. 11 is a structural diagram of a second gate conductive layer, in accordance with some embodiments.
Figure 12:
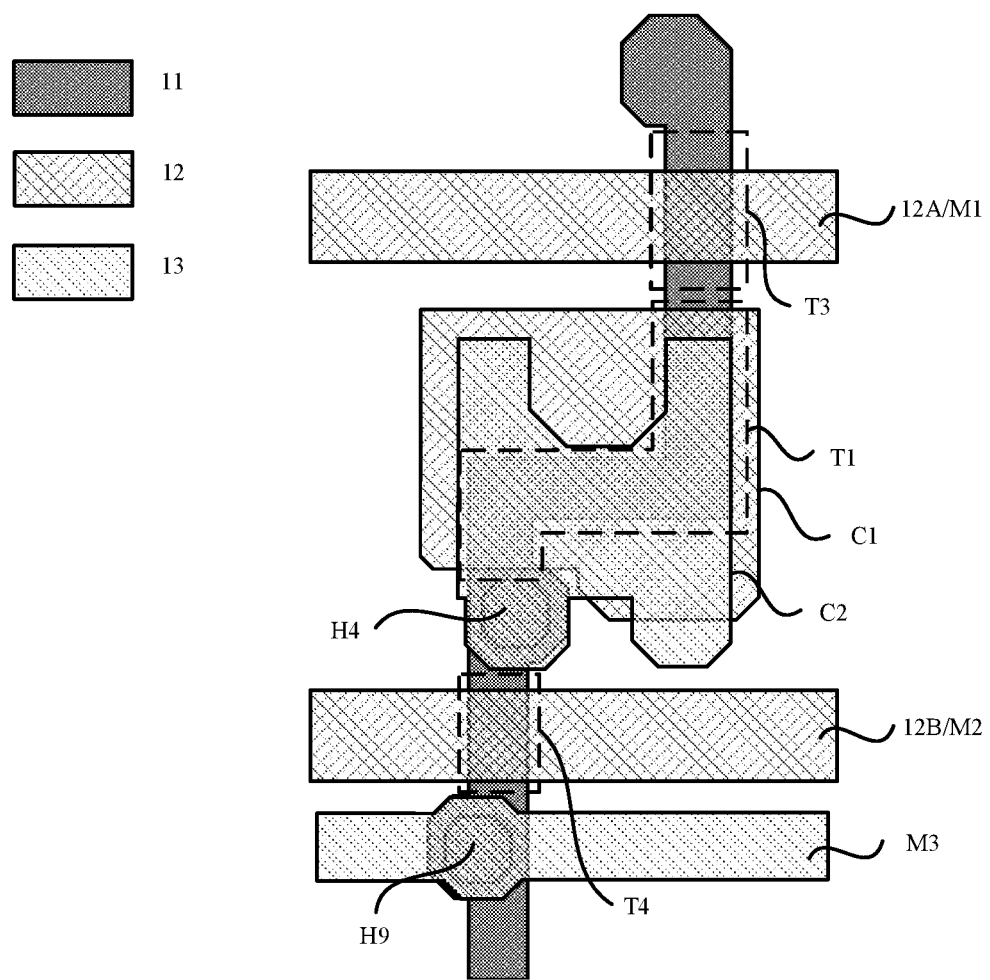
FIG. 12 is a diagram showing a structure where a second gate conductive layer is stacked on a first interlayer dielectric layer.

As shown in FIG. 11, the second gate conductive layer 13 includes a second capacitor electrode plate C2, and the second capacitor electrode plate C2 is configured to be used as another electrode plate of the storage capacitor Cst1. As shown in FIGS. 6 and 12, an orthographic projection of the second capacitor electrode plate C2 on the substrate 10 at least partially overlaps with the orthographic projection of the first capacitor electrode plate C1 on the substrate 10. In a case where a voltage exists between the second capacitor electrode plate C2 and the first capacitor electrode plate C1, the second capacitor electrode plate C2 and the first capacitor electrode plate C1 may store charges.

For example, as shown in FIG. 6, the second capacitor electrode plate C2 is electrically connected to the first active layer pattern 11A.

For example, the display panel 100 further includes a first interlayer dielectric layer 17. As shown in FIG. 6, the first interlayer dielectric layer 17 is disposed between the first gate conductive layer 12 and the second gate conductive layer 13.

For example, the first interlayer dielectric layer 17 is made of a transparent material.

For example, the first interlayer dielectric layer 17 may be provided therein with a plurality of through holes (see a fourth through hole H4 and a ninth through hole H9 in FIG. 10), so as to facilitate an electrical connection between a structure located on a side of the first interlayer dielectric layer 17 proximate to the substrate 10 and a structure located on a side of the first interlayer dielectric layer 17 away from the substrate 10. For example, the ninth through hole H9 may be provided in the first interlayer dielectric layer 17 to realize an electrical connection between a signal line in the second gate conductive layer 13 and an active layer pattern in the first semiconductor layer 11.

As shown in FIG. 6, the first source-drain conductive layer 14 is disposed on a side of the second gate conductive layer 13 away from the substrate 10.

Figure 14:
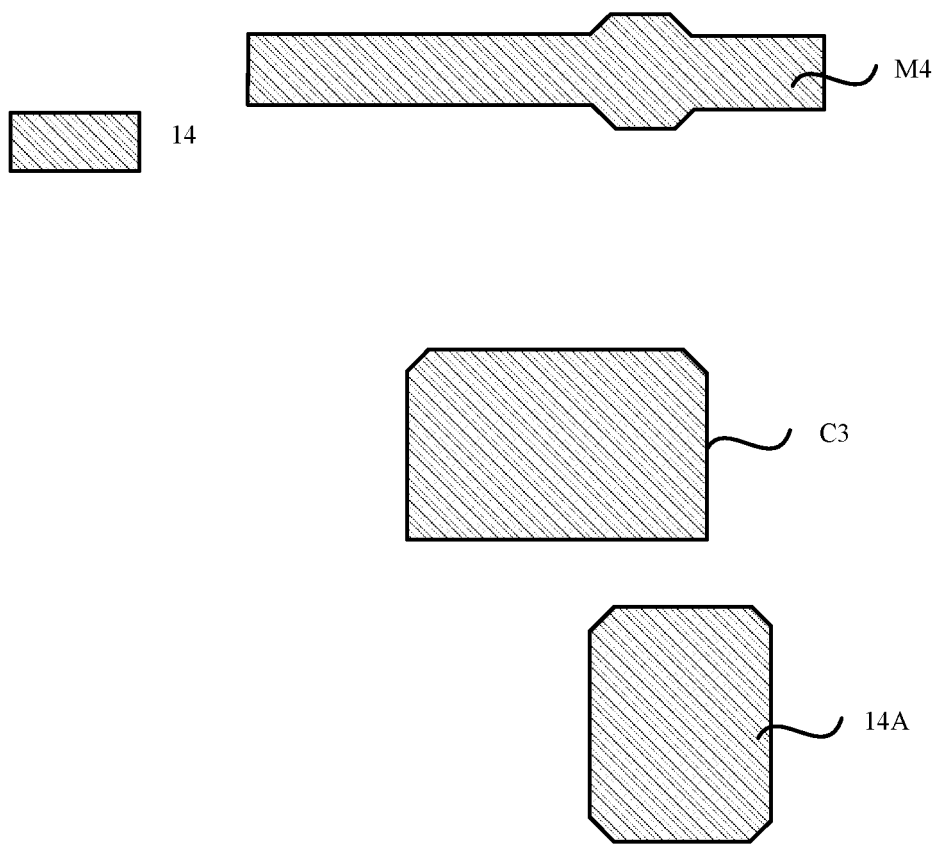
FIG. 14 is a structural diagram of a first source-drain conductive layer, in accordance with some embodiments.
Figure 15:
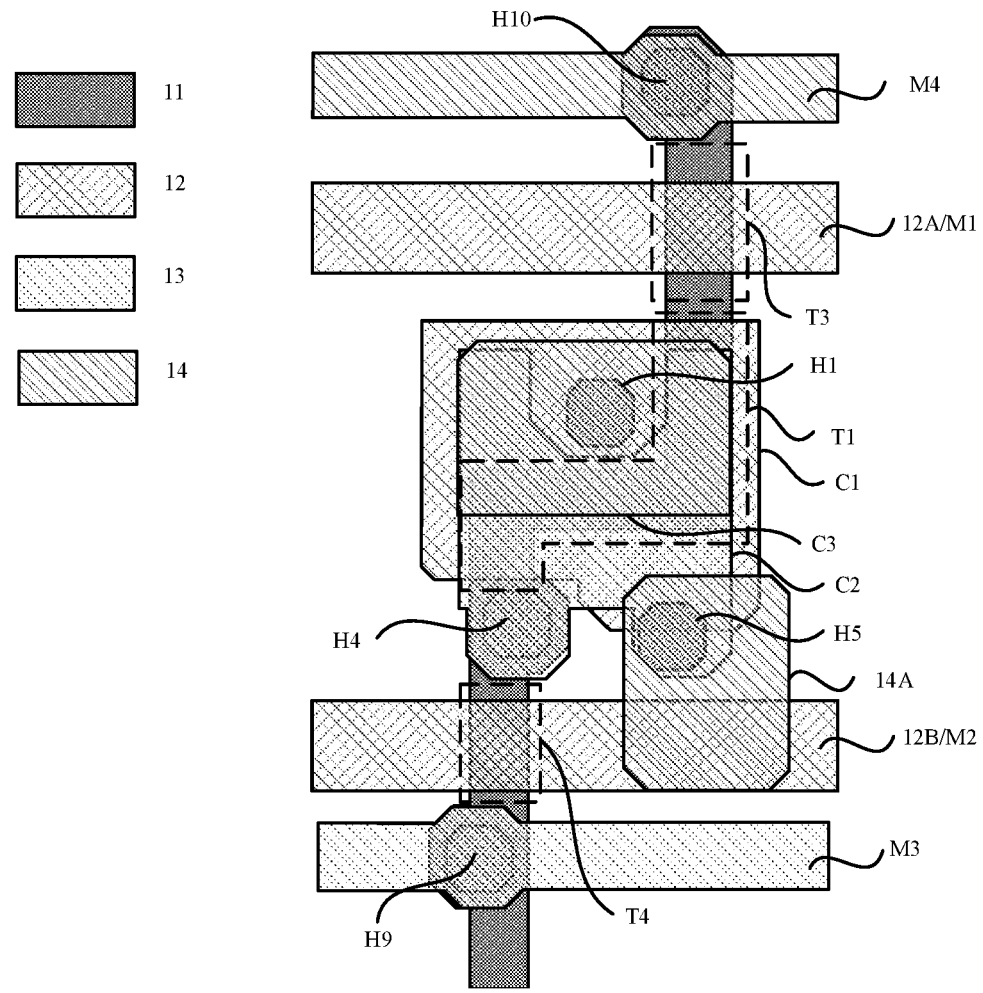
FIG. 15 is a diagram showing a structure where a first source-drain conductive layer is stacked on a second interlayer dielectric layer.

As shown in FIG. 14, the first source-drain conductive layer 14 includes a third capacitor electrode plate C3, and the third capacitor electrode plate C3 is configured to be used as yet another electrode plate of the storage capacitor Cst1. As shown in FIGS. 6 and 15, an orthographic projection of the third capacitor electrode plate C3 on the substrate 10 at least partially overlaps with the orthographic projection of the second capacitor electrode plate C2 on the substrate 10. In a case where a voltage exists between the second capacitor electrode plate C2 and the third capacitor electrode plate C3, the second capacitor electrode plate C2 and the third capacitor electrode plate C3 may store charges.

The third capacitor electrode plate C3 is electrically connected to the first capacitor electrode plate C1. The first capacitor electrode plate C1, the second capacitor electrode plate C2, and the third capacitor electrode plate C3 constitute the storage capacitor Cst1. Two sides of the second capacitor electrode plate C2 proximate to and away from the substrate 10 are provided with capacitor electrode plates, compared to a case where only one side of the second capacitor electrode plate C2 is provided with a capacitor electrode plate, an overlapping area of the storage capacitor Cst1 is increased, so that a capacitance of the storage capacitor Cst1 is increased.

For example, the orthographic projection of the first capacitor electrode plate C1 on the substrate 10 at least partially overlaps with the orthographic projection of the third capacitor electrode plate C3 on the substrate 10, which may ensure that the storage capacitor Cst1 achieves the effect of storing charges, and the components of the storage capacitor Cst1 overlap in a direction perpendicular to the substrate 10. Therefore, a space occupied by the storage capacitor Cst1 in a direction parallel to the substrate 10 is reduced. As a result, the design space of the sub-pixel P is reduced, and the pixels per inch of the display device 1000 is improved.

For example, the display panel 100 further includes a second interlayer dielectric layer 18. As shown in FIG. 6, the second interlayer dielectric layer 18 is disposed between the second gate conductive layer 13 and the first source-drain conductive layer 14.

Figure 13:
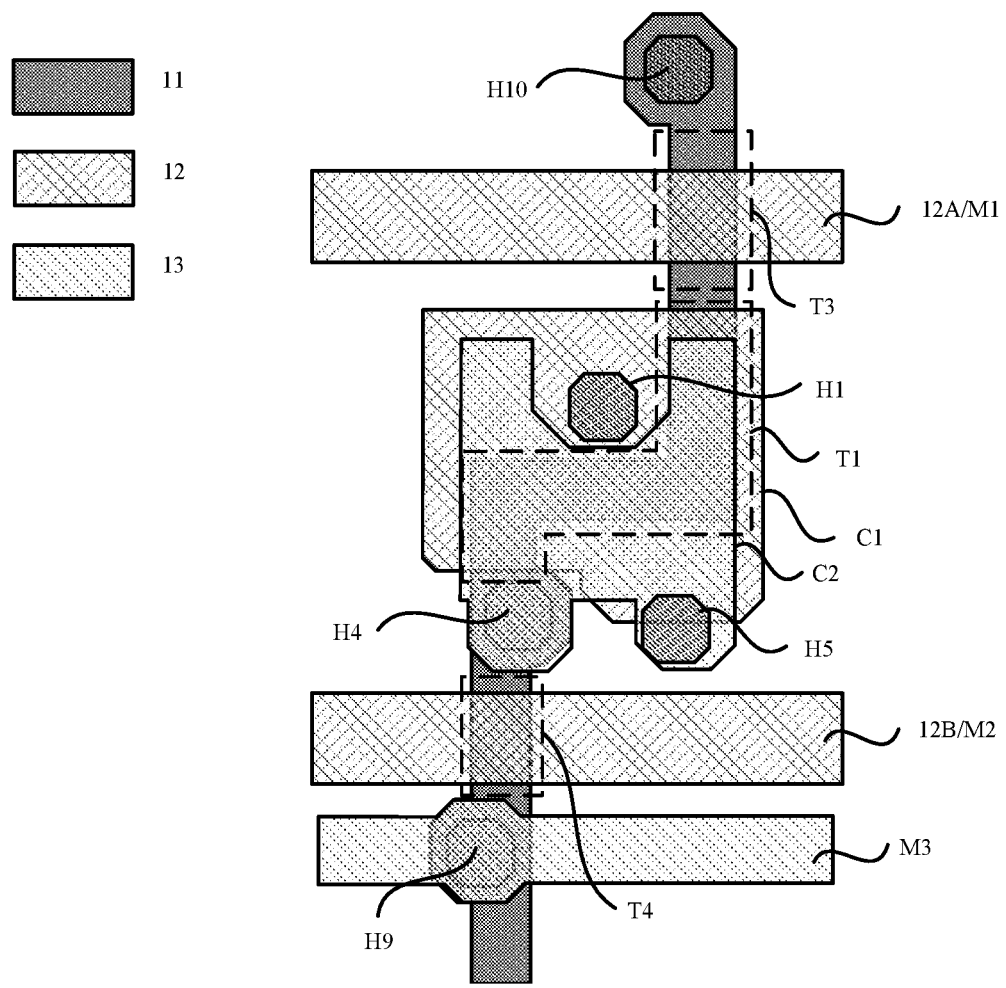
FIG. 13 is a diagram showing a structure where a second interlayer dielectric layer is stacked on a second gate conductive layer.

For example, the second interlayer dielectric layer 18 may be provided therein with a plurality of through holes (see a first through hole H1, a fifth through hole H5, and a tenth through hole H10 in FIG. 13), so as to facilitate an electrical connection between a structure located on a side of the second interlayer dielectric layer 18 proximate to the substrate 10 and a structure located on a side of the second interlayer dielectric layer 18 away from the substrate 10. For example, the fifth through hole H5 may be provided in the second interlayer dielectric layer 18 to realize an electrical connection between the second capacitor electrode plate C2 in the second gate conductive layer 13 and a third connection pattern 14A in the first source-drain conductive layer 14.

As shown in FIG. 6, the second semiconductor layer 15 is disposed on a side of the first source-drain conductive layer 14 away from the substrate 10.

Figure 16:
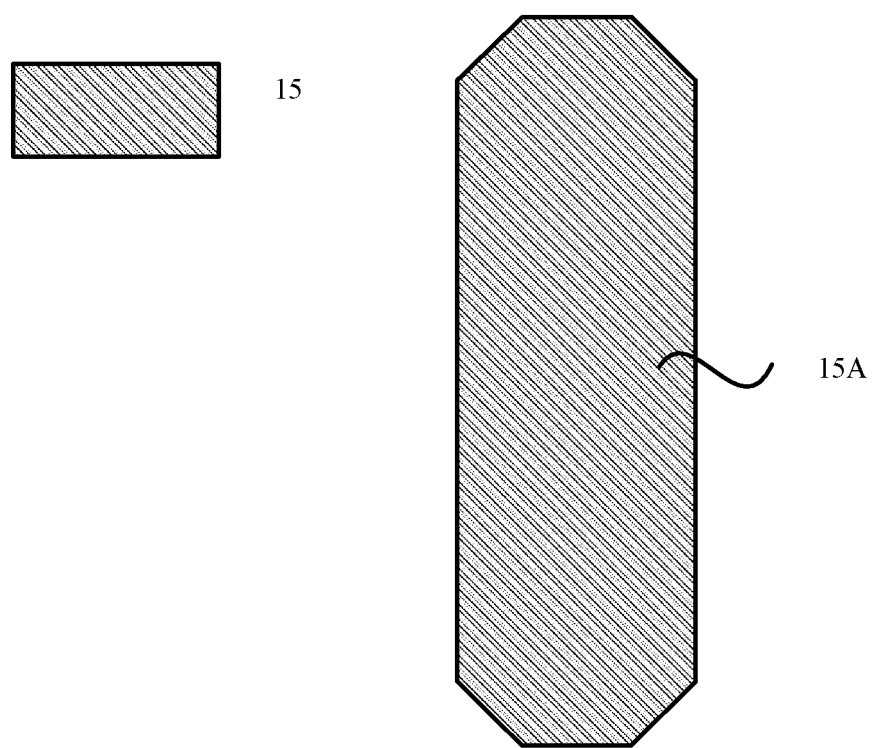
FIG. 16 is a structural diagram of a second semiconductor layer, in accordance with some embodiments.

As shown in FIG. 16, the second semiconductor layer 15 includes a second active layer pattern 15A, and the second active layer pattern 15A is configured to form a source and a drain of the second transistor T2.

For example, a material of the second semiconductor layer 15 may include a low-temperature polysilicon semiconductor material or an oxide semiconductor material. In a case where the material of the second semiconductor layer 15 is an oxide semiconductor material, the second semiconductor layer 15 is formed by a low-temperature process, which may avoid affecting the structures on a side of the second semiconductor layer 15 proximate to the substrate 10.

For example, a conductive pattern is provided on a side of the second semiconductor layer 15 proximate to or away from the substrate 10, and a portion of the conductive pattern overlapping the second semiconductor layer 15 forms a gate of the second transistor T2. For example, the conductive pattern may be located in a third gate conductive layer 19 (see FIG. 18), and/or may be located in a fourth gate conductive layer 25 (see FIG. 27).

In the display panel 100 provided in the embodiments of the present disclosure, the second semiconductor layer 15 is disposed on the side of the first semiconductor layer 11 away from the substrate 10, so that the second transistor T2 and a thin film transistor T (e.g., the first transistor T1) formed by the first semiconductor layer 11 may overlap in the direction perpendicular to the substrate 10. Therefore, the second transistor T2 occupies a design space in the direction perpendicular to the substrate 10, that is, the space occupied by one thin film transistor (the second transistor T2) in the direction parallel to the substrate 10 is reduced. As a result, the design space occupied by the sub-pixel P is reduced, the pixels per inch of the display device 1000 is improved, and the resolution of the small screen display device is improved.

On this basis, in the display panel 100 provided in the embodiments of the present disclosure, the first source-drain conductive layer 14 is disposed between the first semiconductor layer 11 and the second semiconductor layer 15, the first source-drain conductive layer 14 is provided with the third electrode plate C3 therein, the third electrode plate C3 is electrically connected to the first electrode plate C1, and the third electrode plate C3 and the second electrode plate C2 have an overlapping area, so that the storage capacitor Cst1 of a "sandwich" structure is formed. Therefore, an effective overlapping area of the capacitor electrode plates in the storage capacitor Cst1 is increased, the amount of stored charges is increased, and the efficiency of the storage capacitor Cst1 is improved. In addition, the amount of charges stored in the storage capacitor Cst1 of the "sandwich" structure is increased, and the size of each capacitor electrode plate of the storage capacitor Cst1 may be reduced on the premise of satisfying the requirement of the capacitance. Thus, it may be possible to further reduce the planar design space occupied by the sub-pixel P without affecting the performance of the storage capacitor Cst1, improve the pixels per inch of the display device 1000, and improve the resolution of the small screen display device.

For example, as shown in FIG. 6, the display panel 100 further includes a light-emitting device layer 40. The light-emitting device layer 40 is provided therein with a plurality of light-emitting devices L.

As shown in FIG. 6, the light-emitting device layer 40 includes a first electrode layer 401, a pixel defining layer 402, a light-emitting functional layer 403, and a second electrode layer 404 that are sequentially stacked on the side of the pixel circuits 20 away from the substrate 10.

First electrodes L1 of the light-emitting devices L are located in the first electrode layer 401, second electrodes L3 of the light-emitting devices L are located in the second electrode layer 404, and light-emitting patterns L2 of the light-emitting devices L are located in the light-emitting function layer 403. The first electrode L1 located in the first electrode layer 401 is configured to transmit a high-level voltage (e.g., the power supply voltage signal VDD). The second electrode L3 located in the second electrode layer 404 is configured to transmit a low-level voltage (e.g., the cathode voltage signal VSS).

For example, in addition to the light-emitting pattern L2, the light-emitting function layer 403 further includes one or more layers of an electron transport layer (ETL), an electron injection layer (EIL), a hole transport layer (HTL), and a hole injection layer (HIL).

For example, the pixel defining layer 402 is provided therein with a plurality of openings K; at least a portion of a light-emitting pattern L2 is located in an opening K; and light generated by a sub-pixel P is transmitted to outside through an opening K.

For example, a supporting layer 405 may be provided between the pixel defining layer 402 and the second electrode layer 404, and the supporting layer 405 may support a protective film layer, so as to prevent contact between the protective film layer and the first electrode layer 401 or contact between the protective film layer and other wires, which causes the first electrode layer 401 or other wires to be broken.

For example, as shown in FIG. 6, the display panel 100 further includes an encapsulation layer 30. The encapsulation layer 30 may include a first encapsulation sub-layer 301, a second encapsulation sub-layer 302, and a third encapsulation sub-layer 303 that are sequentially arranged in a stack in the direction away from the substrate 10. For example, a material of the first encapsulation sub-layer 301 and a material of the third encapsulation sub-layer 303 each include an inorganic material, and a material of the second encapsulation sub-layer 302 includes an organic material. The first encapsulation sub-layer 301 and the third encapsulation sub-layer 303 have a function of blocking water vapour and oxygen, and the second encapsulation sub-layer 302 has certain flexibility and a function of absorbing water vapour.

As shown in FIG. 4, the first transistor T1 and the second transistor T2 are electrically connected, so that an electrical signal (e.g., a data signal Data or a reference signal Ref) in the second transistor T2 is transmitted to the first transistor T1.

In some embodiments, the second active layer pattern 15A is electrically connected to the third capacitor electrode plate C3. That is, the third capacitor electrode plate C3 is used as a connection layer, which electrically connects the second active layer pattern 15A to the first capacitor electrode plate C1, thereby realizing the electrical connection between the first transistor T1 and the second transistor T2.

By electrically connecting the second active layer pattern 15A and the third capacitor electrode plate C3, the electrical connection between the first transistor T1 and the second transistor T2 is realized. That is, the third capacitor electrode plate C3 is used as a capacitor electrode plate of the storage capacitor Cst1, and is also used as a connection pattern for electrically connecting the gate of the first transistor T1 and the source or drain of the second transistor T2. Therefore, the design space of one connection pattern may be saved, the planar design space occupied by the sub-pixel P is further reduced, the pixels per inch of the display device 1000 is improved, and the resolution of the small screen display device is improved.

Figure 17:
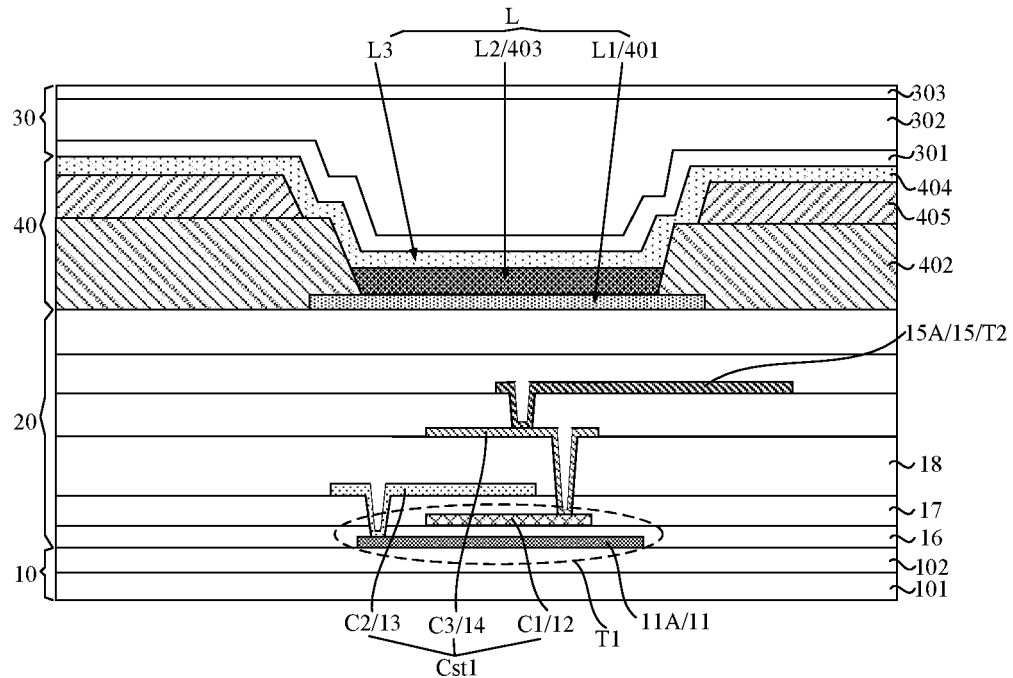
FIG. 17 is yet another sectional view taken along the section line B-B' in FIG. 2.

In exemplary embodiments, as shown in FIG. 17, the second active layer pattern 15A is directly electrically connected to the third capacitor electrode plate C3.

Figure 18:
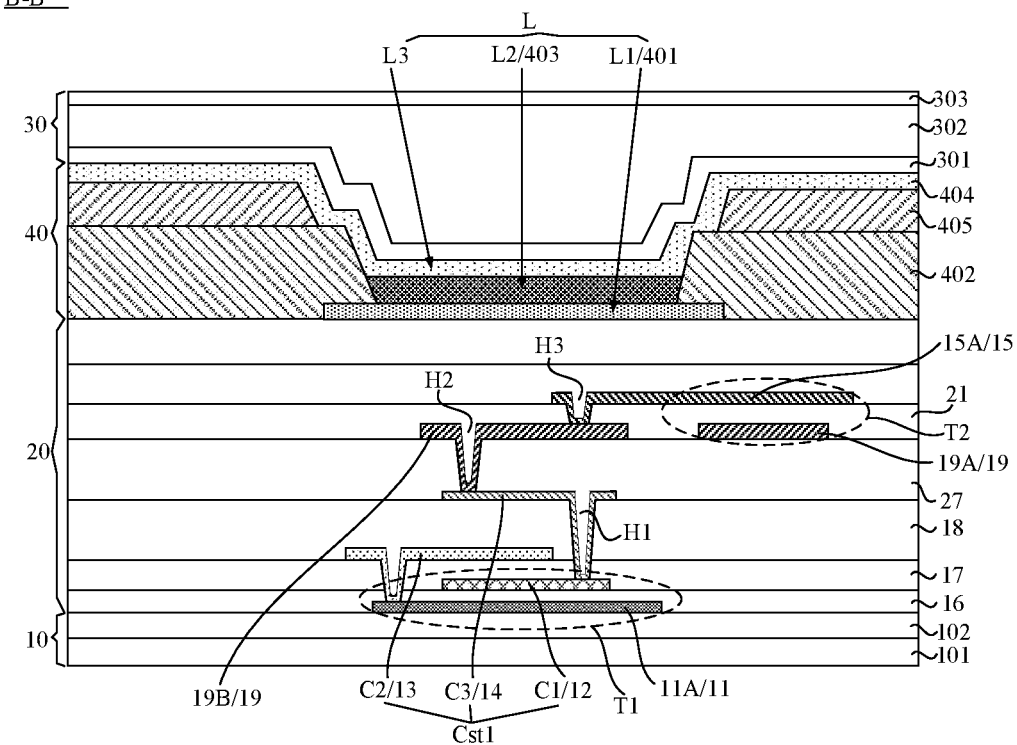
FIG. 18 is yet another sectional view taken along the section line B-B' in FIG. 2.

In exemplary embodiments, as shown in FIG. 18, the display panel 100 further includes a third gate conductive layer 19 disposed between the first source-drain conductive layer 14 and the second semiconductor layer 15. The third gate conductive layer 19 is configured to provide the gate of the second transistor T2, and is further configured to provide a connection pattern to cause the second active layer pattern 15A to be indirectly electrically connected to the third capacitor electrode plate C3.

Figure 20:
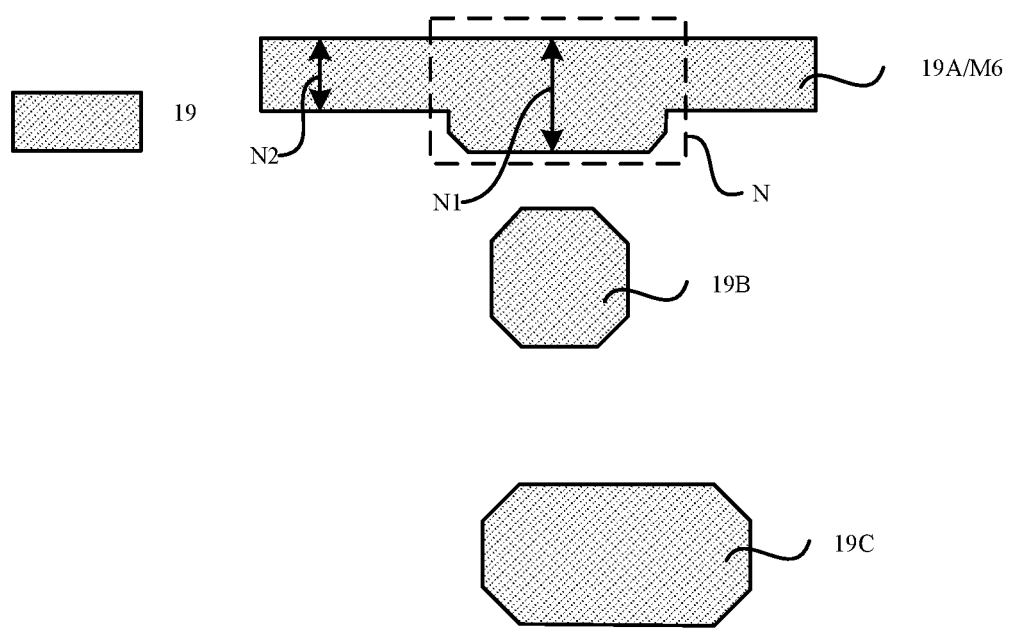
FIG. 20 is a structural diagram of a third gate conductive layer, in accordance with some embodiments.
Figure 21:
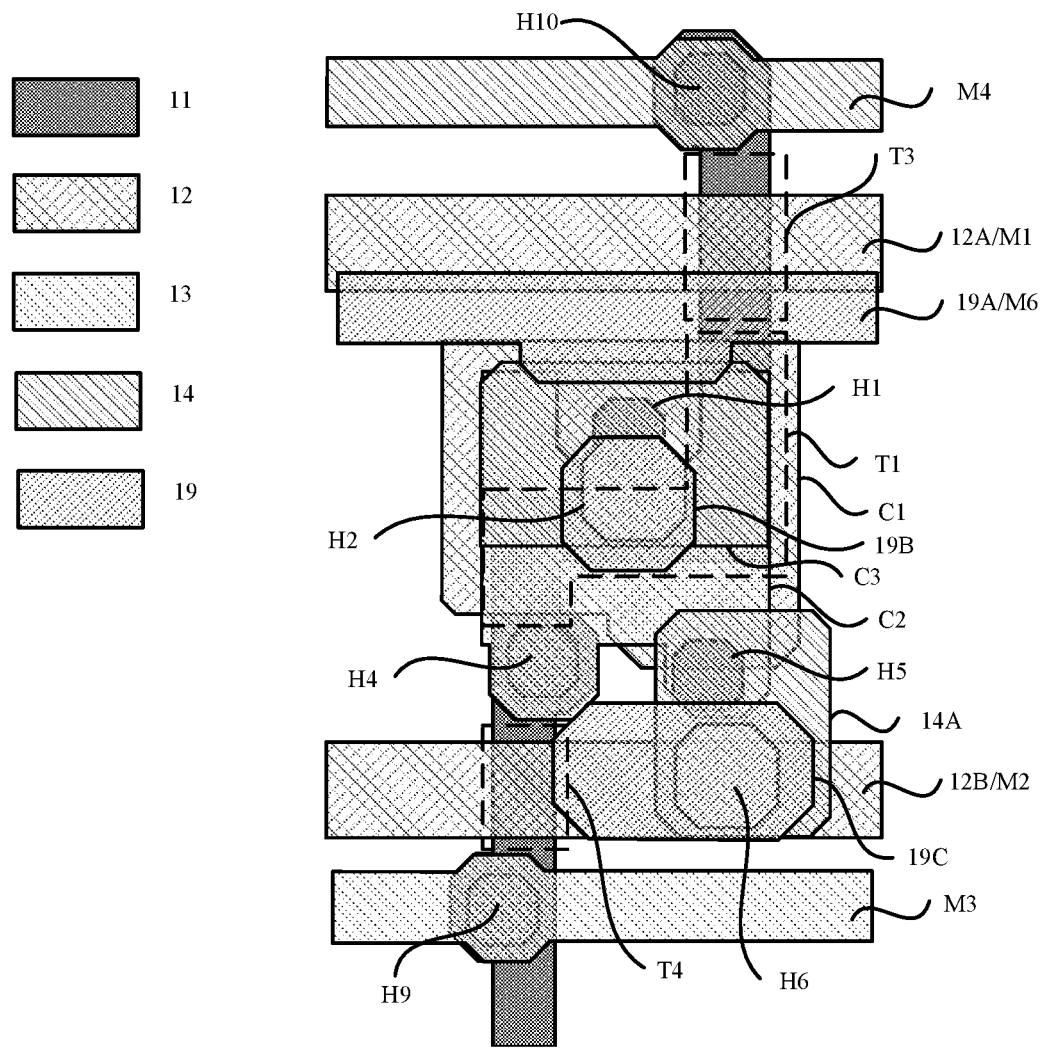
FIG. 21 is a diagram showing a structure where a third gate conductive layer is stacked on a first planarization layer.

As shown in FIGS. 20 and 21, the third gate conductive layer 19 includes a first gate conductive pattern 19A and a first connection pattern 19B.

The first gate conductive pattern 19A is configured to form a first gate of the second transistor T2.

The second active layer pattern 15A is electrically connected to the third capacitor electrode plate C3 through the first connection pattern 19B. That is, the first connection pattern 19B is electrically connected to the second active layer pattern 15A and the third capacitor electrode plate C3.

The third gate conductive layer 19 is provided therein with the first gate of the second transistor T2 (i.e., the first gate conductive pattern 19A), and is further provided therein with the connection pattern (i.e., the first connection pattern 19B), so that the second active layer pattern 15A is indirectly electrically connected to the third capacitor electrode plate C3, which avoids that the second active layer pattern 15A is electrically connected to the third capacitor electrode plate C3 through a through hole with a deep depth. Therefore, it is possible to improve the effect of the connection between the second active layer pattern 15A and the third capacitor electrode plate C3, avoid the existence of disconnection, and reduce the process difficulty.

For example, the display panel 100 further includes a first planarization layer 27. As shown in FIG. 18, the first planarization layer 27 is disposed between the first source-drain conductive layer 14 and the third gate conductive layer 19.

For example, the first planarization layer 27 may be provided therein with a plurality of through holes (see a second through hole H2 and a sixth through hole H6 in FIG. 19), so as to facilitate an electrical connection between a structure located on a side of the first planarization layer 27 proximate to the substrate 10 and a structure located on a side of the first planarization layer 27 away from the substrate 10. For example, the second through hole H2 may be disposed in the first planarization layer 27, so as to realize the electrical connection between the third capacitor electrode plate C3 in the first source-drain conductive layer 14 and the first connection pattern 19B in the third gate conductive layer 19.

Figure 23:
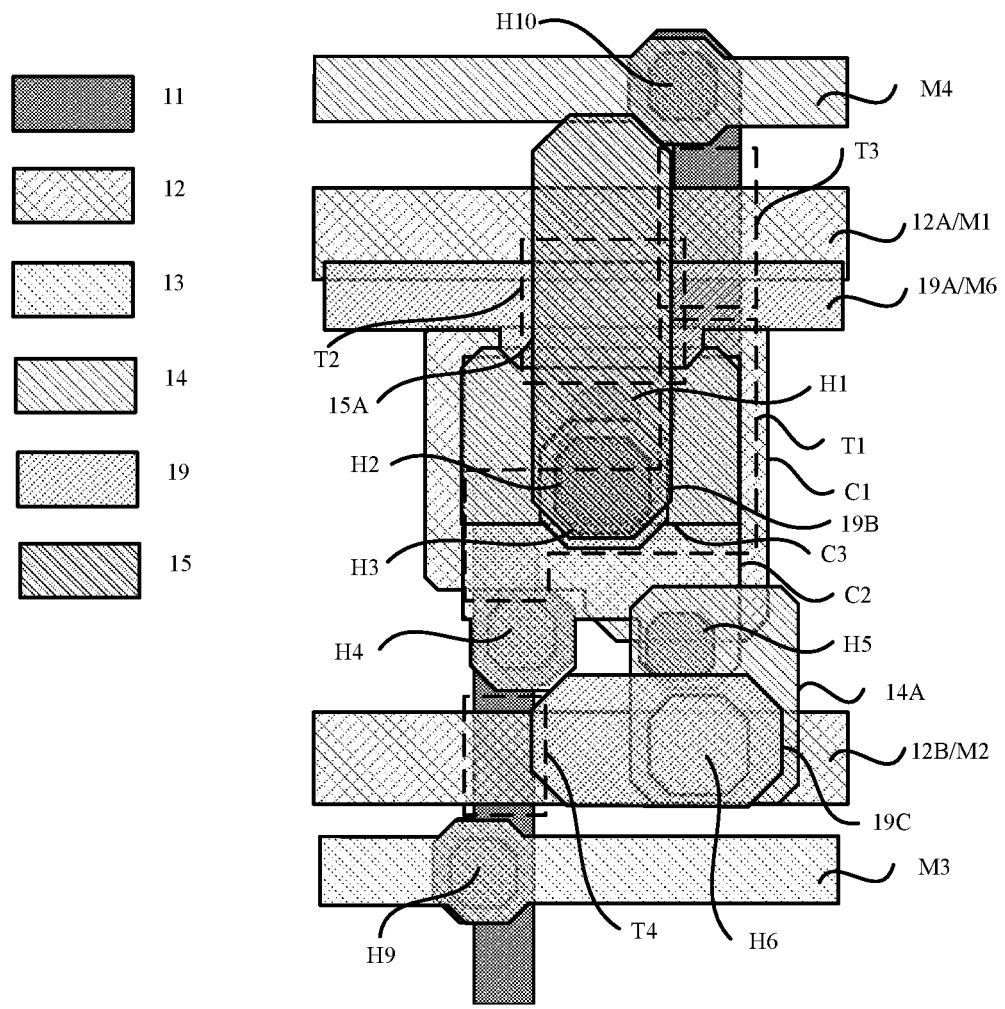
FIG. 23 is a diagram showing a structure where a second semiconductor layer is stacked on a second gate insulating layer.

For example, as shown in FIG. 23, the second semiconductor layer 15 in FIG. 16 is disposed on a side of the third gate conductive layer 19 away from the substrate 10. An orthographic projection of the first gate conductive pattern 19A on the substrate 10 at least partially overlaps with an orthographic projection of the second active layer pattern 15A on the substrate 10. An overlapping portion of the first gate conductive pattern 19A is used as the gate of the second transistor T2.

For example, as shown in FIG. 20, a width N1 of a portion N of the first gate conductive pattern 19A for overlapping the second active layer pattern 15A is greater than widths N2 of two ends of the first gate conductive pattern 19A. Therefore, the second transistor T2 has a long channel and a small width-to-length ratio, which is conducive to reducing current fluctuation and improving stability of an output current.

For example, the display panel 100 further includes a second gate insulating layer 21. As shown in FIG. 18, the second gate insulating layer 21 is disposed between the third gate conductive layer 19 and the second semiconductor layer 15.

For example, the second gate insulating layer 21 may be provided therein with a through hole (see a third through hole H3 in FIG. 22), so as to facilitate the electrical connection between the first connection pattern 19B and the second active layer pattern 15A.

In some embodiments, as shown in FIG. 18, the display panel 100 further includes a first interlayer dielectric layer 17, a second interlayer dielectric layer 18, a first planarization layer 27, and a second gate insulation layer 21.

As shown in FIG. 18, the first interlayer dielectric layer 17 is disposed between the first gate conductive layer 12 and the second gate conductive layer 13; the second interlayer dielectric layer 18 is disposed between the second gate conductive layer 13 and the first source-drain conductive layer 14; the first planarization layer 27 is disposed between the first source-drain conductive layer 14 and the third gate conductive layer 19; and the second gate insulating layer 21 is disposed between the third gate conductive layer 19 and the second semiconductor layer 15.

Figure 19:
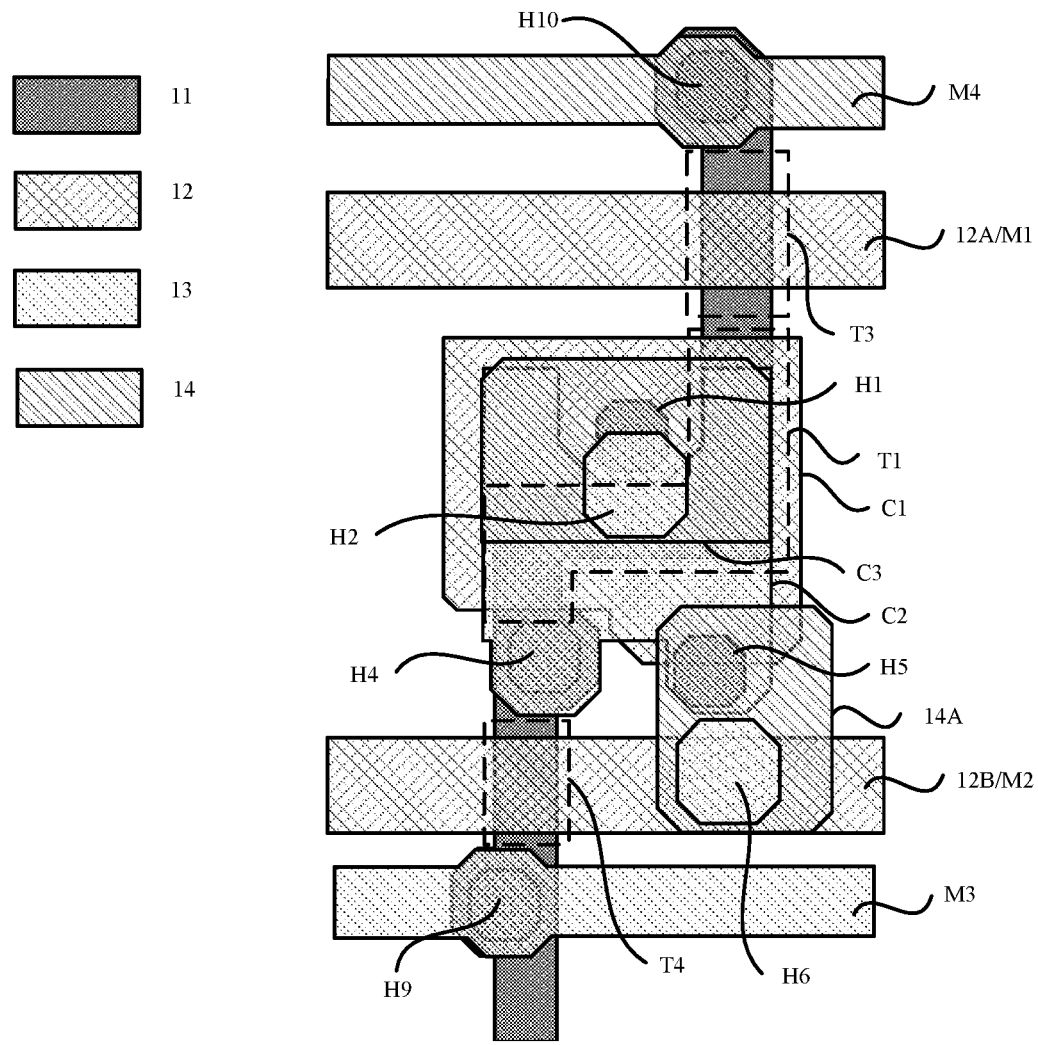
FIG. 19 is a diagram showing a structure where a first planarization layer is stacked on a first source-drain conductive layer.
Figure 22:
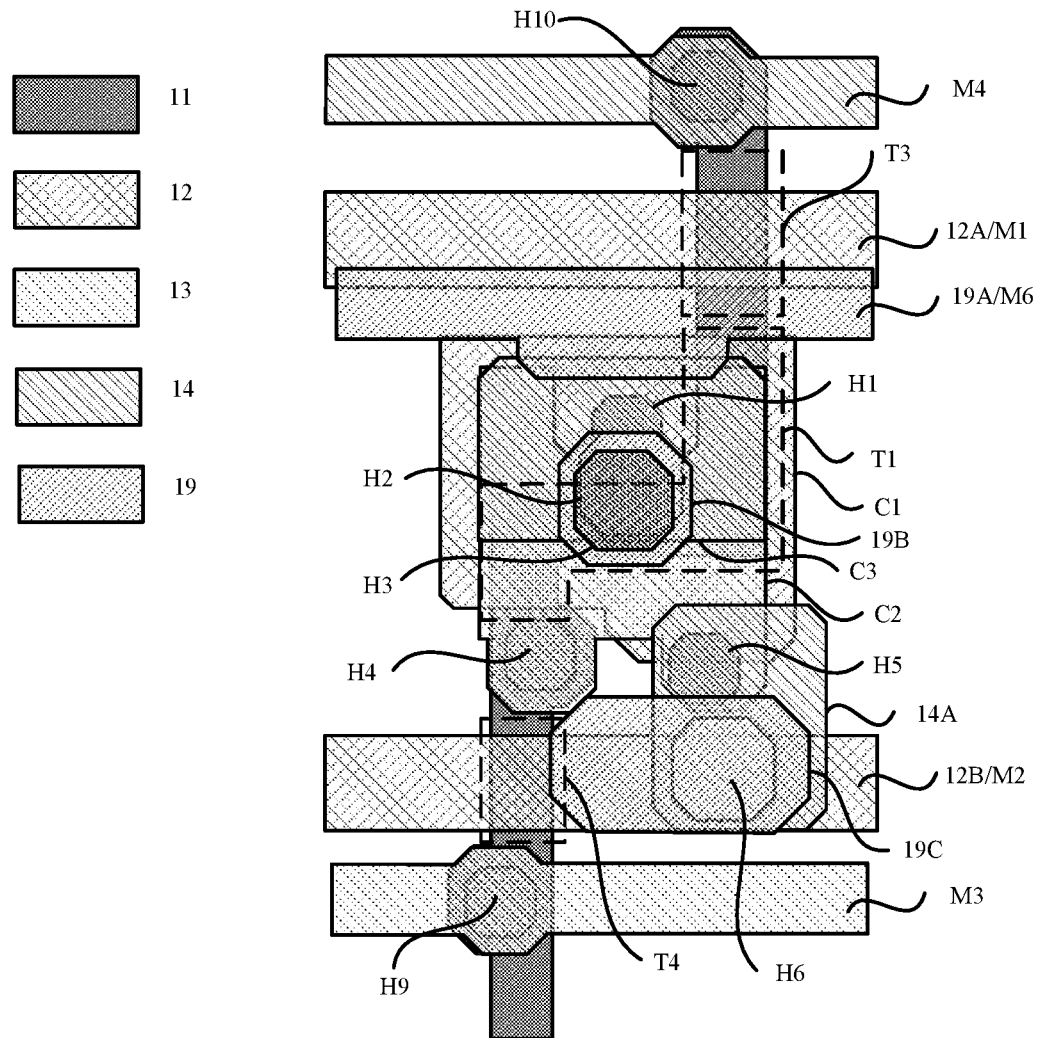
FIG. 22 is a diagram showing a structure where a second gate insulating layer is stacked on a third gate conductive layer.

As shown in FIGS. 13, 19 and 22, the display panel 100 is provided with a first through hole H1, a second through hole H2 and a third through hole H3 therein.

Referring to FIG. 18, the first through hole H1 penetrates through the first interlayer dielectric layer 17 and the second interlayer dielectric layer 18, and the third capacitor electrode plate C3 is electrically connected to the first capacitor electrode plate C1 through the first through hole H1. The second through hole H2 penetrates through the first planarization layer 27, and the first connection pattern 19B is electrically connected to the third capacitor electrode plate C3 through the second through hole H2. The third through hole H3 penetrates through the second gate insulating layer 21, and the second active layer pattern 15A is electrically connected to the first connection pattern 19B through the third through hole H3.

In exemplary embodiments, orthogonal projections of at least two of the first through hole H1, the second through hole H2, and the third through hole H3 on the substrate 10 at least partially overlap.

For example, as shown in FIG. 18, orthogonal projections of the first through hole H1 and the third through hole H3 on the substrate 10 overlap.

By providing the connection pattern (e.g., the first connection pattern 19B) and the through holes (e.g., the first through hole H1 and the third through hole H3), at least two through holes overlap in the direction perpendicular to the substrate 10, so that the design space occupied by the through holes in the direction parallel to the substrate 10 is reduced. Therefore, the planar design space occupied by the sub-pixel P is reduced, and the pixels per inch of the display device 1000 is improved, and the resolution of the small screen display device is improved.

In some embodiments, as shown in FIG. 4, the first transistor T1, the storage capacitor Cst1 and the light-emitting device L are electrically connected at the second node N2, thus achieving the purpose of effectively driving, by the first transistor T1, the light-emitting device L to emit light.

Figure 24:
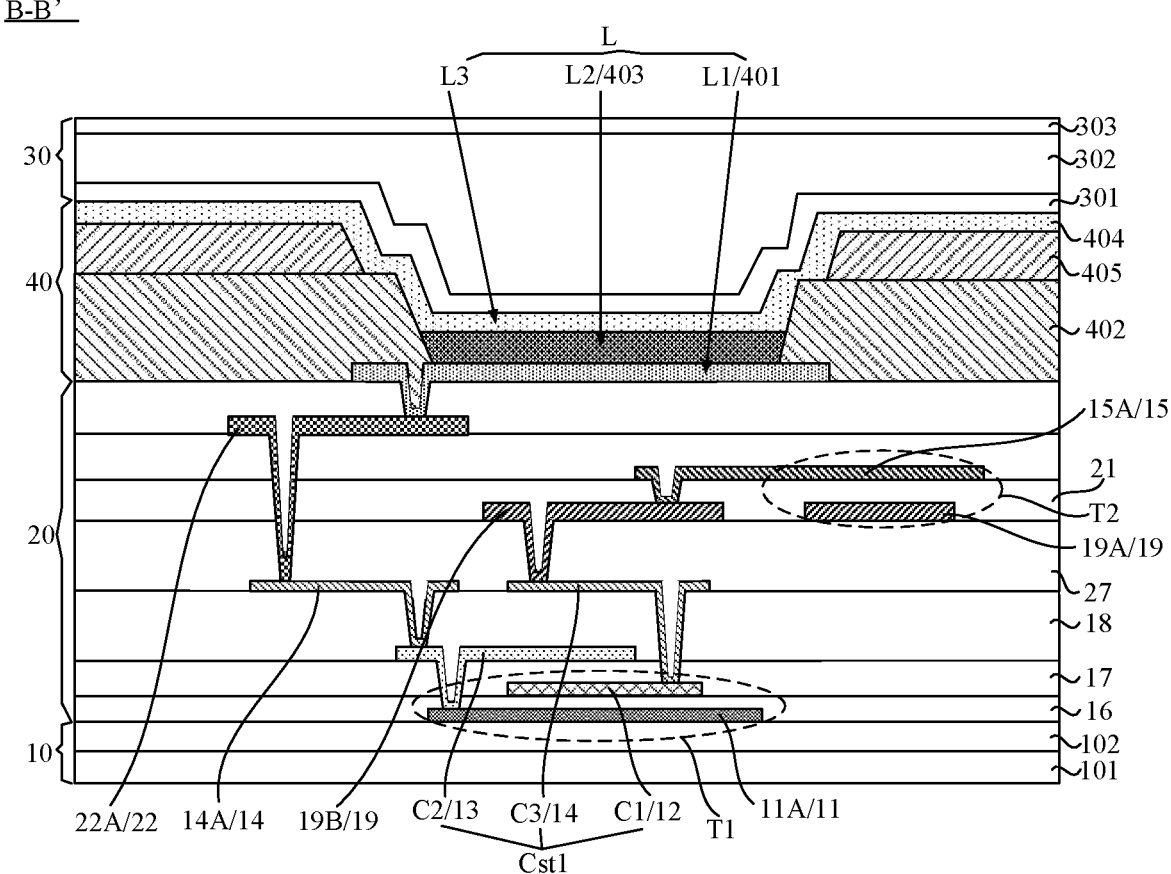
FIG. 24 is yet another sectional view taken along the section line B-B' in FIG. 2.

In exemplary embodiments, as shown in FIG. 24, the display panel 100 further includes a second source-drain conductive layer 22 and a first electrode layer 401. The second source-drain conductive layer 22 is disposed on a side of the second semiconductor layer 15 away from the substrate 10. The first electrode layer 401 is disposed on a side of the second source-drain conductive layer 22 away from the substrate 10, and the first electrode layer 401 includes the first electrodes L1.

Figure 25:
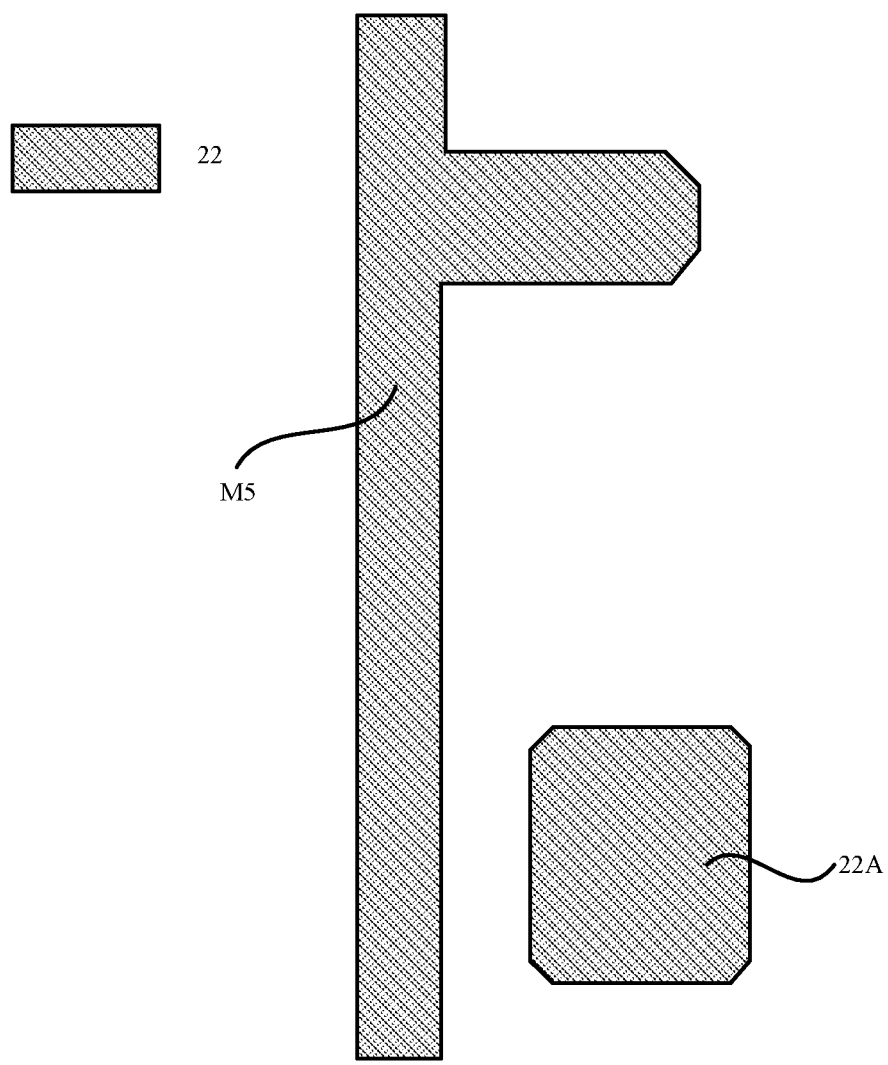
FIG. 25 is a structural diagram of a second source-drain conductive layer, in accordance with some embodiments.

As shown in FIG. 25, the second source-drain conductive layer 22 includes a second connection pattern 22A.

As shown in FIG. 14, the first source-drain conductive layer 14 further includes a third connection pattern 14A.

As shown in FIG. 24, the third connection pattern 14A is electrically connected to the second connection pattern 22A and the second capacitor electrode plate C2. The first electrode L1 is electrically connected to the second connection pattern 22A. That is, the first electrode L1, the second connection pattern 22A, the third connection pattern 14A, the second capacitor electrode plate C2 and the first active layer pattern 11A are electrically connected in sequence. That is, the first electrode L1 is electrically connected to the second capacitor electrode plate C2 through the second connection pattern 22A and the third connection pattern 14A, and is finally electrically connected to the first active layer pattern 11A, thereby realizing the electrical connection between the first transistor T1, the storage capacitor Cst1 and the light-emitting device L.

By providing the connection pattern (i.e., the third connection pattern 14A) in the first source-drain conductive layer 14 and the connection pattern (i.e., the second connection pattern 22A) in the second source-drain conductive layer 22, the design space of the two source-drain conductive layers (the first source-drain conductive layer 14 and the second source-drain conductive layer 22) is fully used, and the effective electrical connection between the first transistor T1, the storage capacitor Cst1 and the light-emitting device L is realized. As a result, it may be possible to avoid increasing the process difficulty, and ensure that the performance of the display device 1000 is not affected.

For example, an orthographic projection of the second connection pattern 22A on the substrate 10 at least partially overlaps with an orthographic projection of the third connection pattern 14A on the substrate 10, so that the design space occupied by the connection patterns in the direction parallel to the substrate 10 may be reduced. Therefore, the space occupied by the sub-pixel P is reduced, the pixels per inch of the display device 1000 is increased, and the resolution of the small screen display device is improved.

Figure 26:
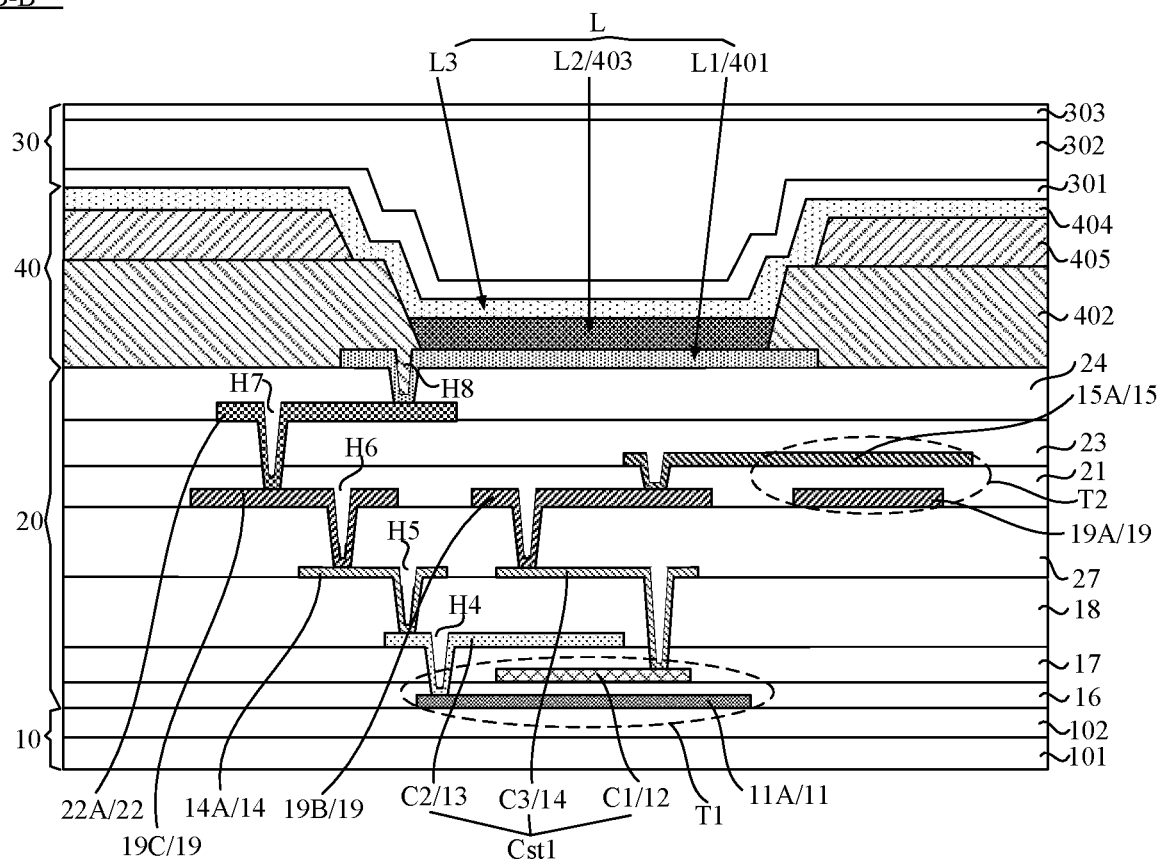
FIG. 26 is yet another sectional view taken along the section line B-B' in FIG. 2.

In exemplary embodiments, as shown in FIG. 26, the display panel 100 further includes a third gate conductive layer 19 disposed between the first source-drain conductive layer 14 and the second semiconductor layer 15.

As shown in FIGS. 20 and 26, the third gate conductive layer 19 further includes a fourth connection pattern 19C. The third connection pattern 14A is electrically connected to the second connection pattern 22A through the fourth connection pattern 19C. That is, the fourth connection pattern 19C is electrically connected to the second connection pattern 22A and the third connection pattern 14A.

By providing the connection pattern (i.e., the fourth connection pattern 19C) in the third gate conductive layer 19, the connection between the second connection pattern 22A and the third connection pattern 14A is achieved. That is, the first electrode L1 is electrically connected to the second capacitor electrode plate C2 through the second connection pattern 22A, the fourth connection pattern 19C and the third connection pattern 14A, and is finally electrically connected to the first active layer pattern 11A.

Therefore, it is possible to avoid that an excessive deep through hole is provided between the second connection pattern 22A and the third connection pattern 14A, and in turn optimize the effect of the electrical connection of the first transistor T1, the storage capacitor Cst1, and the light-emitting device L at the second node N2. In addition, the design space of the third gate conductive layer 19 is fully utilized to avoid that the connection patterns occupy too much design space in the direction parallel to the substrate 10. As a result, the space occupied by the sub-pixel P is reduced, the pixels per inch of the display device 1000 is increased, and the resolution of the small screen display device is improved.

In some embodiments, as shown in FIG. 26, the display panel 100 further includes a first gate insulating layer 16, a first interlayer dielectric layer 17, a second interlayer dielectric layer 18, a first planarization layer 27, a second gate insulating layer 21, a third interlayer dielectric layer 23, and a second planarization layer 24.

As shown in FIG. 26, the first gate insulating layer 16 is disposed between the first semiconductor layer 11 and the first gate conductive layer 12. The first interlayer dielectric layer 17 is disposed between the first gate conductive layer 12 and the second gate conductive layer 13. The second interlayer dielectric layer 18 is disposed between the second gate conductive layer 13 and the first source-drain conductive layer 14. The first planarization layer 27 is disposed between the first source-drain conductive layer 14 and the third gate conductive layer 19. The second gate insulating layer 21 is disposed between the third gate conductive layer 19 and the second semiconductor layer 15. The third interlayer dielectric layer 23 is disposed between the second semiconductor layer 15 and the second source-drain conductive layer 22. The second planarization layer 24 is disposed between the second source-drain conductive layer 22 and the first electrode layer 401.

As shown in FIGS. 10, 13, 19, 30 and 32, the display panel 100 is provided therein with a fourth through hole H4, a fifth through hole H5, a sixth through hole H6, a seventh through hole H7 and an eighth through hole H8.

Referring to FIG. 26, the fourth through hole H4 penetrates through the first gate insulating layer 16 and the first interlayer dielectric layer 17, and the second capacitor electrode plate C2 is electrically connected to the first active layer pattern 11A through the fourth through hole H4. The fifth through hole H5 penetrates through the second interlayer dielectric layer 18, and the third connection pattern 14A is electrically connected to the second capacitor electrode plate C2 through the fifth through hole H5. The sixth through hole H6 penetrates through the first planarization layer 27, and the fourth connection pattern 19C is electrically connected to the third connection pattern 14A through the sixth through hole H6. The seventh through hole H7 penetrates through the second gate insulation layer 21 and the third interlayer dielectric layer 23, and the second connection pattern 22A is electrically connected to the fourth connection pattern 19C through the seventh through hole H7. The eighth through hole H8 penetrates through the second planarization layer 24, and the first electrode L1 is electrically connected to the second connection pattern 22A through the eighth through hole H8.

In exemplary embodiments, orthogonal projections of at least two of the fourth through hole H4, the fifth through hole H5, the sixth through hole H6, the seventh through hole H7, and the eighth through hole H8 on the substrate 10 at least partially overlap.

For example, as shown in FIG. 26, orthogonal projections of the eighth through hole H8 and the fifth through hole H5 on the substrate 10 overlap.

In the process of connecting the light-emitting device L and the first transistor T1, by providing the connection pattern (e.g., the fourth connection pattern 19C) and the through hole (e.g., the fourth through hole H4), at least two through holes overlap in the direction perpendicular to the substrate 10, so that the design space occupied by the through holes in the direction parallel to the substrate 10 is reduced. As a result, the planar design space occupied by the sub-pixel P is reduced, the pixels per inch of the display device 1000 is improved, and the resolution of the small screen display device is improved.

Figure 27:
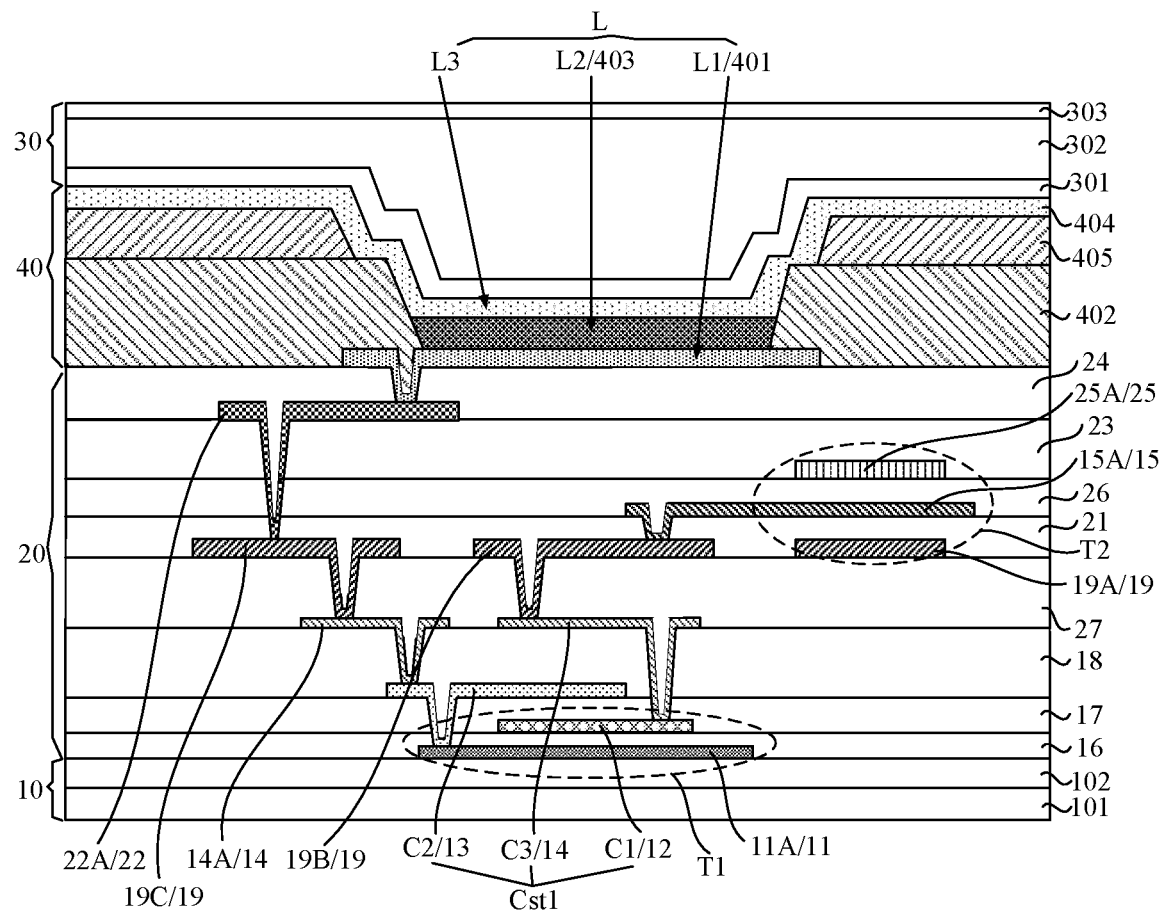
FIG. 27 is yet another sectional view taken along the section line B-B' in FIG. 2.

In some embodiments, as shown in FIG. 27, the display panel 100 further includes a fourth gate conductive layer 25 disposed on the side of the second semiconductor layer 15 away from the substrate 10.

Figure 28:
FIG. 28 is a structural diagram of a fourth gate conductive layer, in accordance with some embodiments.

As shown in FIG. 28, the fourth gate conductive layer 25 includes a fourth gate conductive pattern 25A. The fourth gate conductive pattern 25A is configured to form a second gate of the second transistor T2, and an orthographic projection of the fourth gate conductive pattern 25A on the substrate 10 at least partially overlaps with the orthographic projection of the first gate conductive pattern 19A on the substrate 10.

That is, each of the first gate conductive pattern 19A and the fourth gate conductive pattern 25A at least partially overlaps the second semiconductor layer 15. The first gate conductive pattern 19A and the fourth gate conductive pattern 25A are respectively used as the first gate and the second gate of the second transistor T2, so that a dual-gate structure is formed, and the transmission effect of the second transistor T2 is improved.

Figure 29:
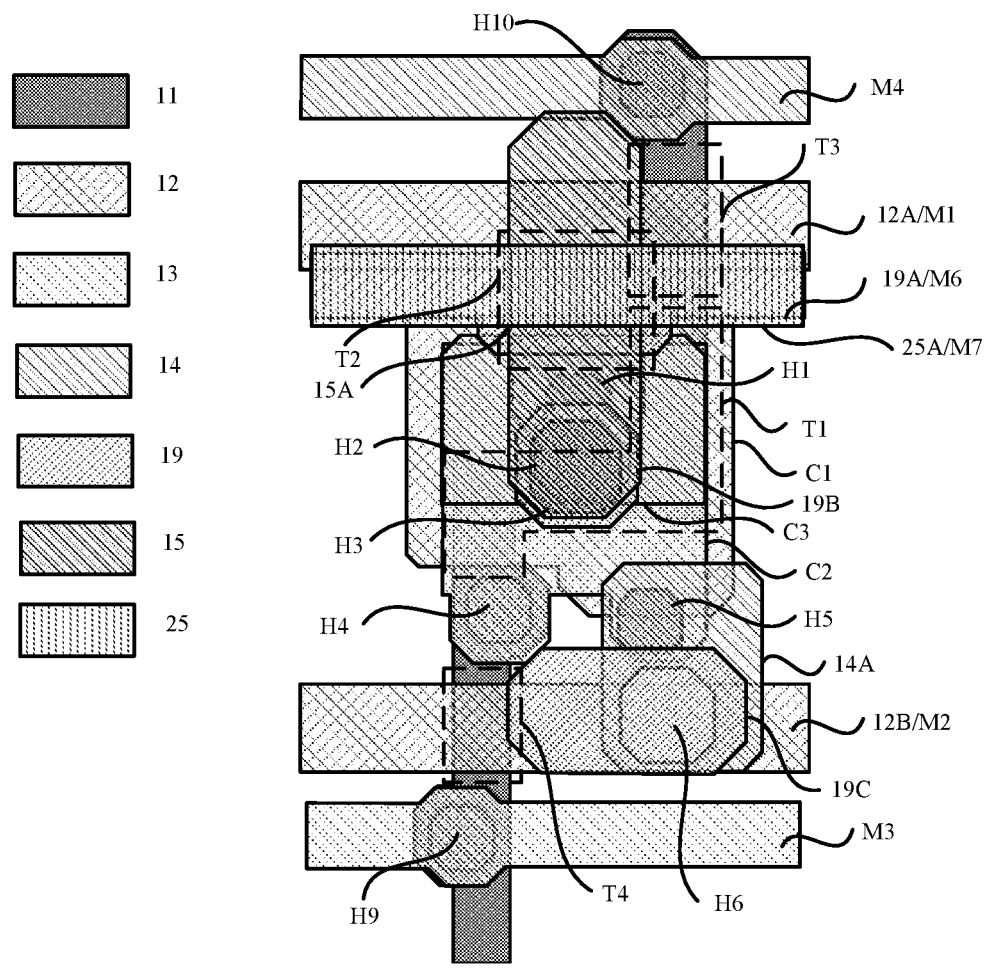
FIG. 29 is a diagram showing a structure where a fourth gate conductive layer is stacked on a second semiconductor layer.

For example, as shown in FIG. 29, the fourth gate conductive layer 25 is disposed on the side of the second semiconductor layer 15 away from the substrate 10.

For example, the display panel 100 further includes a third gate insulating layer 26. As shown in FIG. 27, the third gate insulating layer 26 is disposed between the second semiconductor layer 15 and the fourth gate conductive layer 25.

For example, the third gate insulating layer 26 may be provided with a through hole therein, so as to facilitate the electrical connection between the first gate conductive layer 12 and the second gate conductive layer 13. For example, the seventh through hole H7 penetrates through the second gate insulating layer 21 and the third interlayer dielectric layer 23, and further penetrates through the third gate insulating layer 26, which facilitates the electrical connection between the second connection pattern 22A and the fourth connection pattern 19C.

Figure 31:
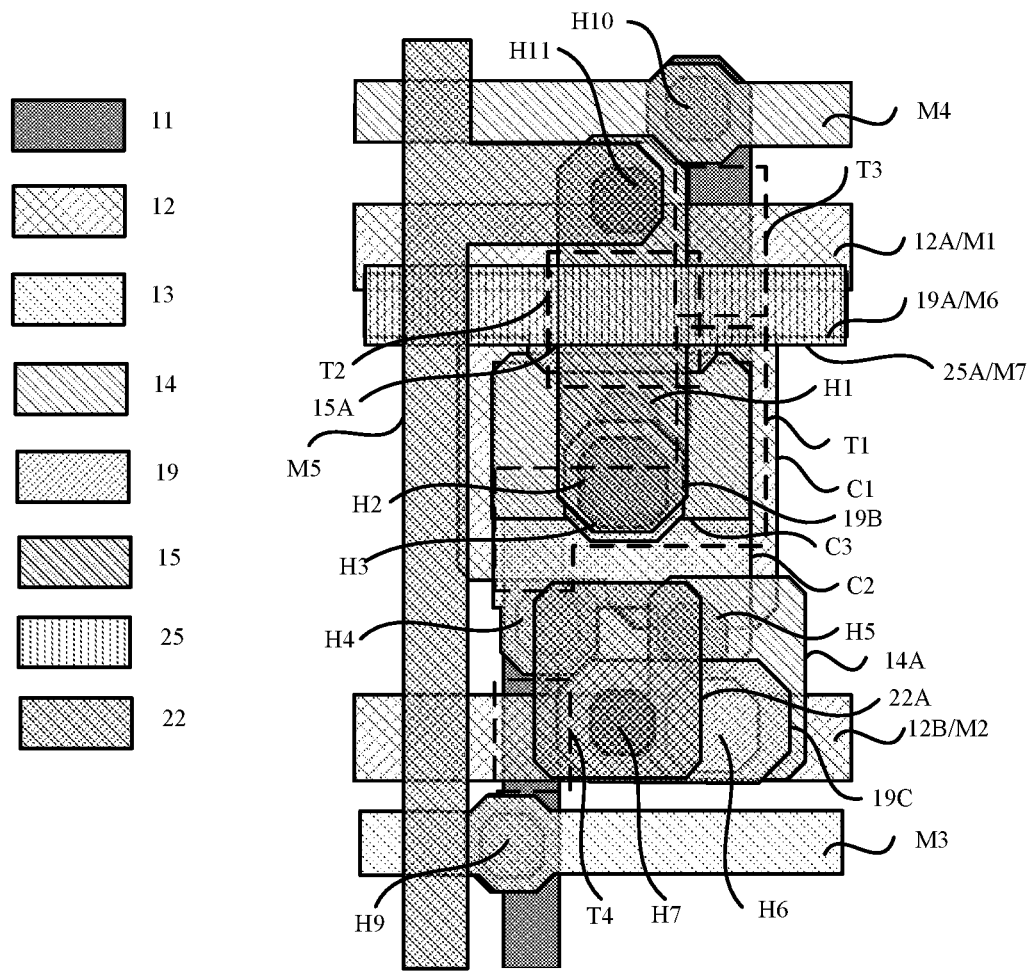
FIG. 31 is a diagram showing a structure where a second source-drain conductive layer is stacked on a third interlayer dielectric layer.
Figure 32:
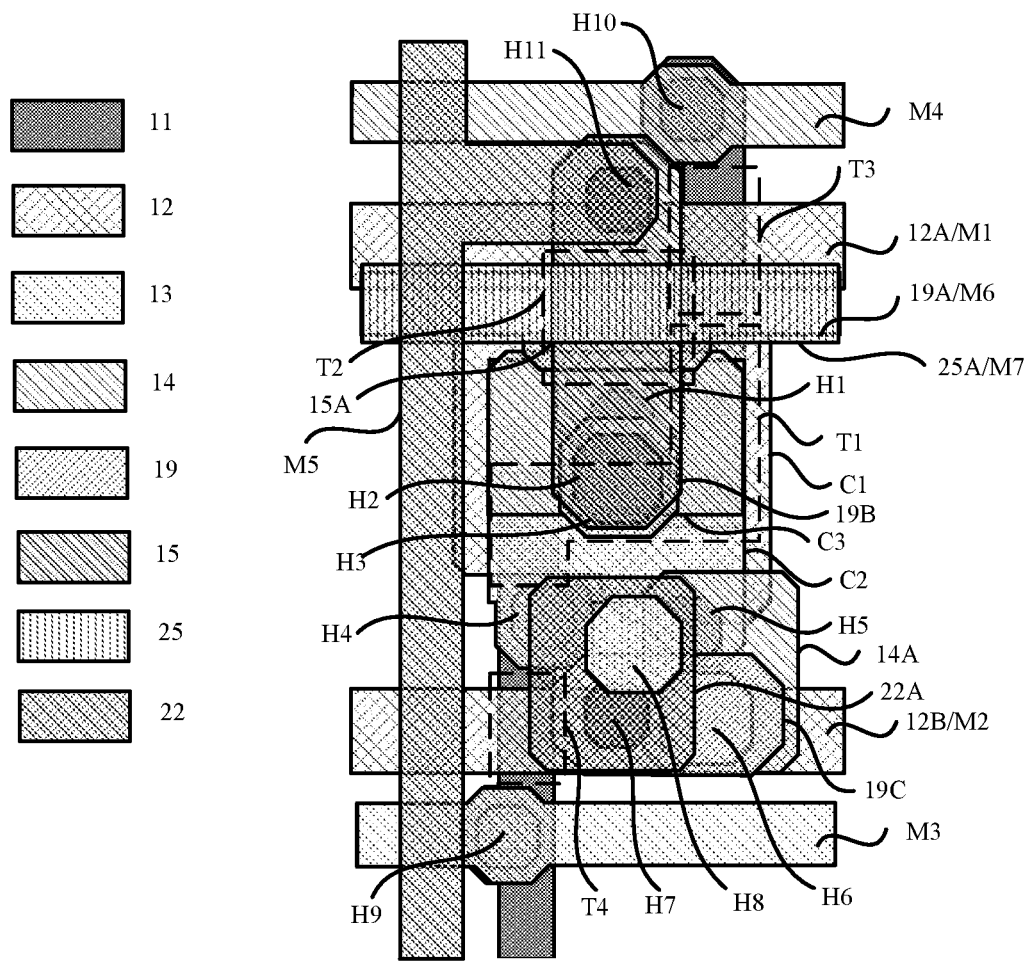
FIG. 32 is a diagram showing a structure where a second planarization layer is stacked on a second source-drain conductive layer.

In exemplary embodiments, as shown in FIG. 31, the second source-drain conductive layer 22 is disposed on a side of the fourth gate conductive layer 25 away from the substrate 10.

For example, the display panel 100 further includes a third interlayer dielectric layer 23. As shown in FIG. 27, the third interlayer dielectric layer 23 is disposed between the fourth gate conductive layer 25 and the second source-drain conductive layer 22.

Figure 30:
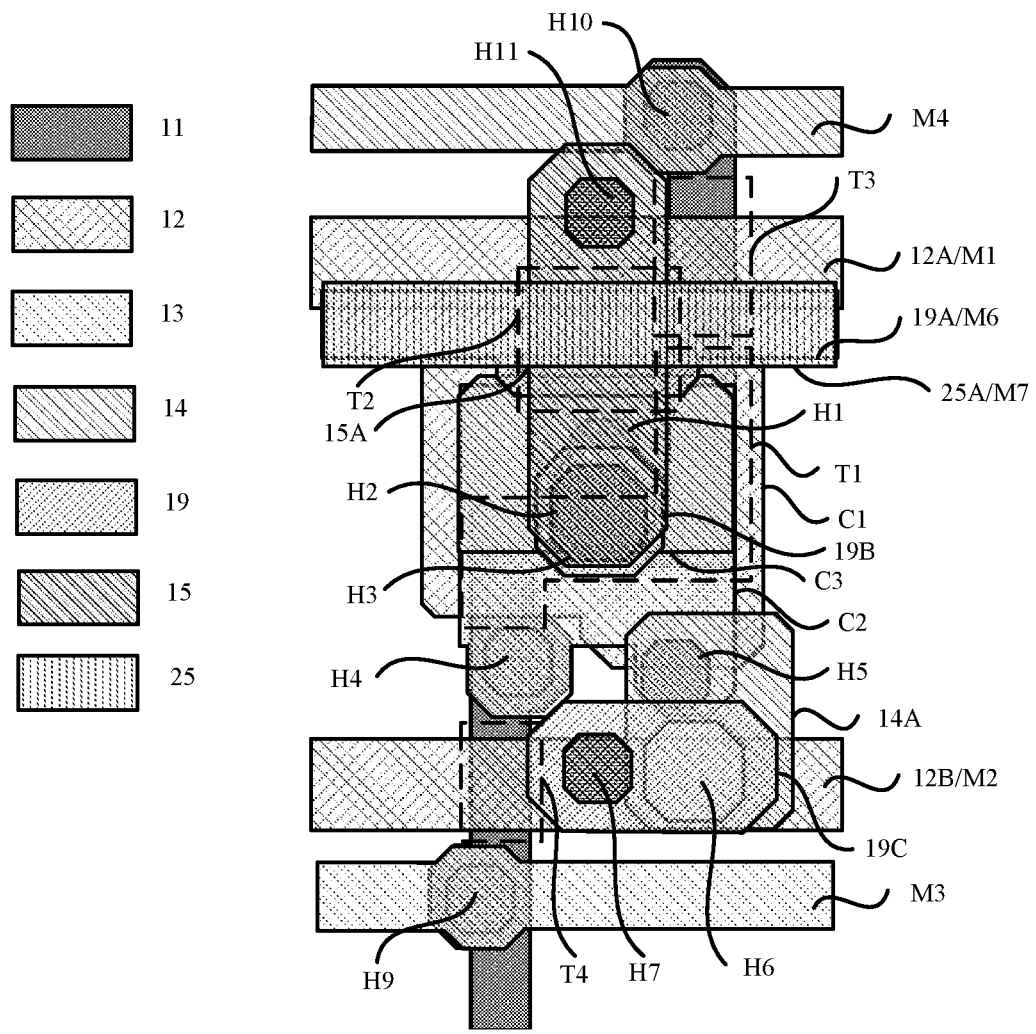
FIG. 30 is a diagram showing a structure where a third interlayer dielectric layer is stacked on a fourth gate conductive layer.

For example, the third interlayer dielectric layer 23 may be provided therein with through holes (see the seventh through hole H7 and an eleventh through hole H11 in FIG. 30), so as to facilitate an electrical connection between a structure located on a side of the third interlayer dielectric layer 23 proximate to the substrate 10 and a structure located on a side of the third interlayer dielectric layer 23 away from the substrate 10. For example, the seventh through hole H7 may be disposed in the third interlayer dielectric layer 23, so as to realize the electrical connection between the second connection pattern 22A and the fourth connection pattern 19C.

In exemplary embodiments, the film layers of the light-emitting device layer 40 are sequentially stacked on a side of the driving circuit 20 away from the substrate 10.

Figure 33:
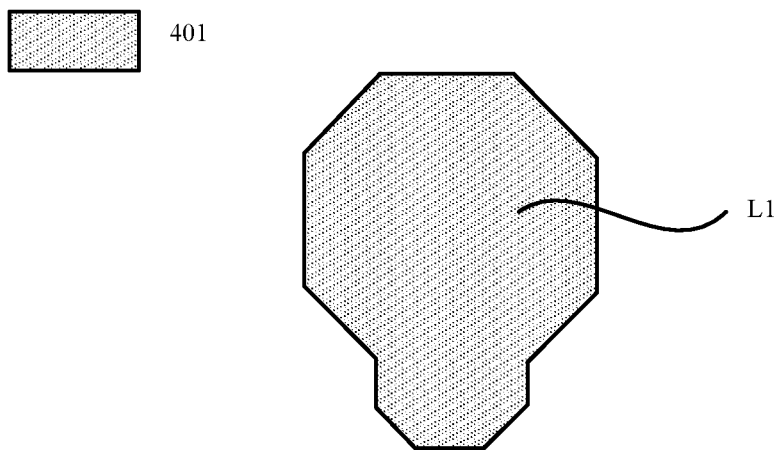
FIG. 33 is a structural diagram of a first anode layer, in accordance with some embodiments.
Figure 34:
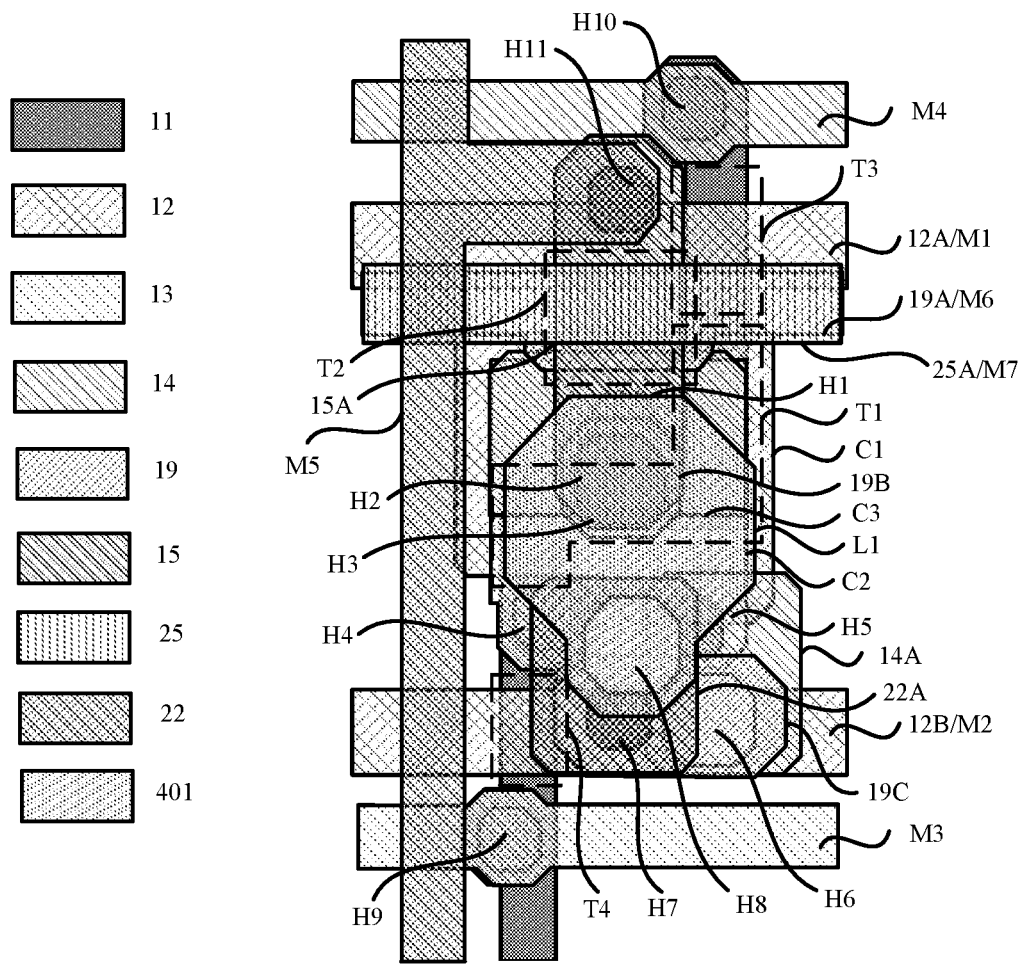
FIG. 34 is a diagram showing a structure where a first anode layer is stacked on a second planarization layer.

For example, as shown in FIGS. 33 and 34, the first electrode layer 401 of the light-emitting device layer 40 is disposed on the side of the second source-drain conductive layer 22 away from the substrate 10, and the first electrode layer 401 includes the first electrodes L1.

For example, the display panel 100 further includes a second planarization layer 24. As shown in FIGS. 26 and 27, the second planarization layer 24 is disposed between the second source-drain conductive layer 22 and the first electrode layer 401. The second planarization layer 24 may be provided therein with at least one through hole, such as the eighth through hole H8 in FIG. 32. The eighth through hole H8 penetrates through the second planarization layer 24, so as to facilitate the electrical connection between the first electrode L1 of the first electrode layer 401 and the second connection pattern 22A of the second source-drain conductive layer 22.

Figure 35:
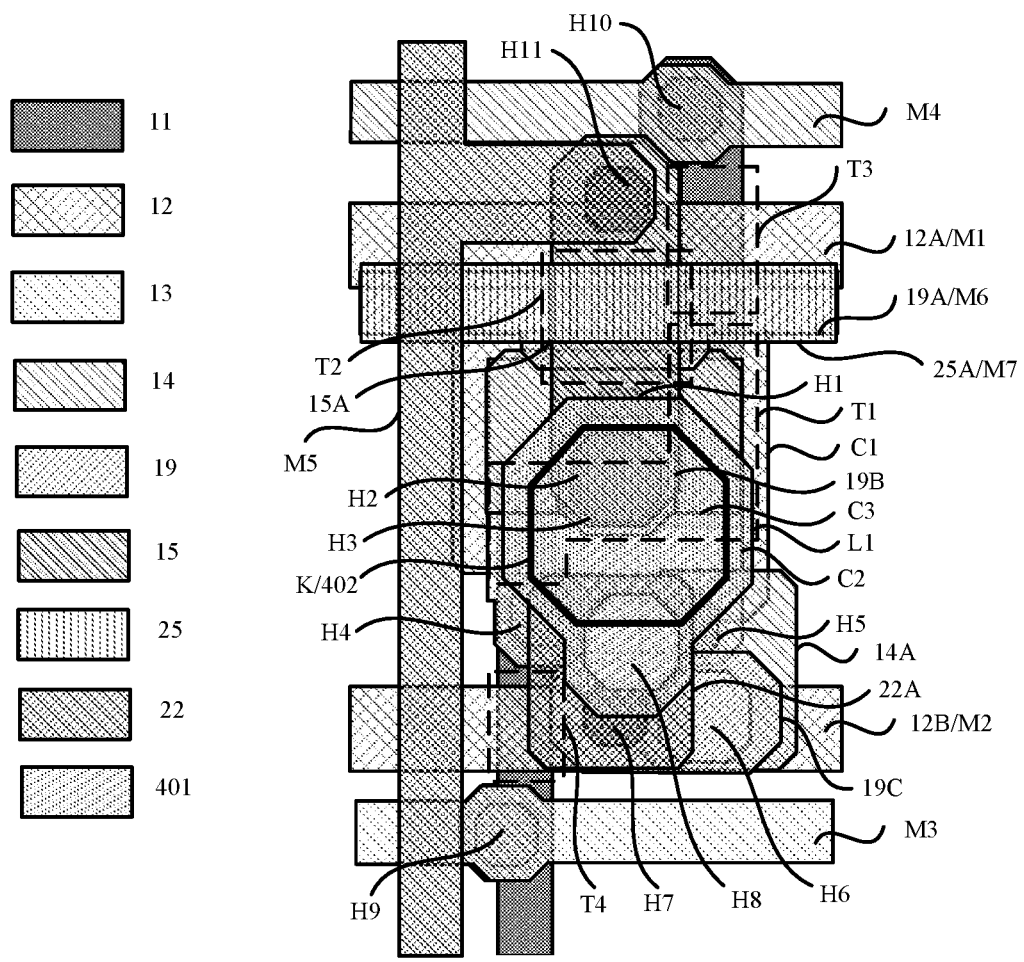
FIG. 35 is a structural diagram of a pixel defining layer, in accordance with some embodiments.

For example, the display panel 100 further includes a pixel defining layer 402. As shown in FIGS. 26 and 27, the pixel defining layer 402 is disposed on a side of the first electrode layer 401 away from the substrate 10. As shown in FIG. 35, the pixel defining layer 402 is provided with openings K therein, and an opening K is arranged corresponding to a first electrode L1.

Referring to FIG. 35, the opening K exposes at least a portion of the first electrode L1. Each opening K is used to define an effective light-emitting area of a light-emitting device L.

For example, the light-emitting function layer 403 is formed on the pixel defining layer 402. The light-emitting pattern L2 of the light-emitting function layer 403 is in contact with the first electrode L1 through the opening K.

For example, the second electrode layer 404 is formed on the light-emitting function layer 403.

The second electrode layer 404 is arranged as a whole layer, and is used as the second electrodes L3 and configured to transmit a low-level voltage.

The high-level voltage transmitted by the first electrode L1 and the low-level voltage of the second electrode L3 together create an electric field. Under driving of the electric field, holes in the first electrode layer 401 and electrons in the second electrode layer 404 are transmitted to the light-emitting pattern L2 located in the opening K. The holes and the electrons combine to form excitons in the light-emitting pattern L2 to emit light.

Figure 36:
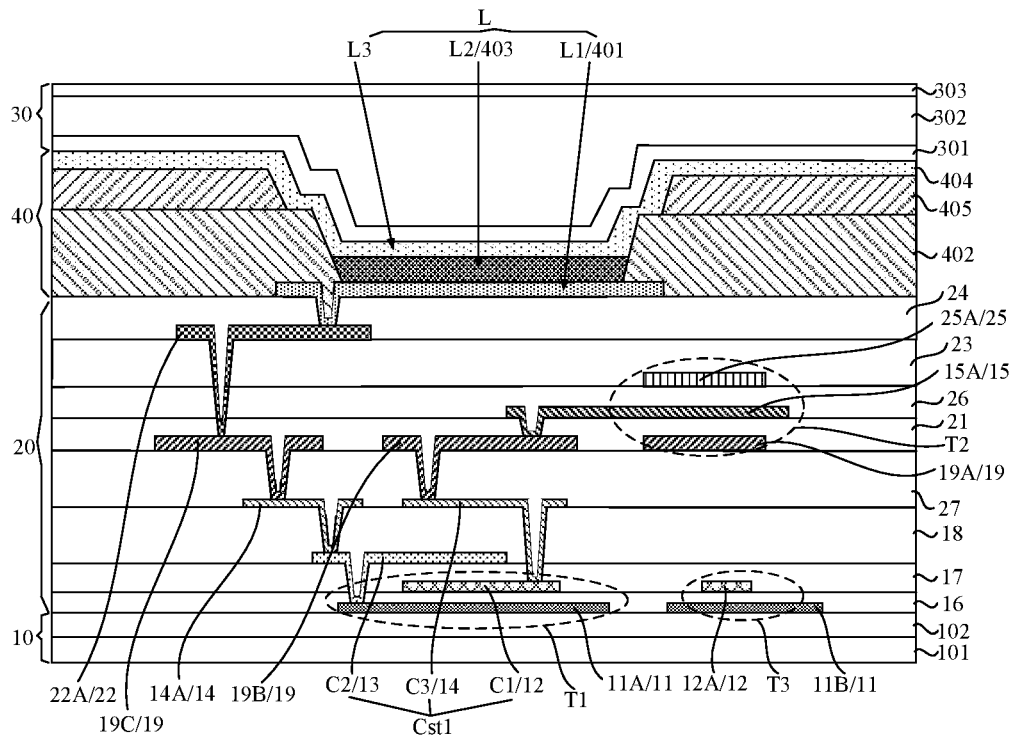
FIG. 36 is yet another sectional view taken along the section line B-B' in FIG. 2.

In some embodiments, as shown in FIG. 36, the display panel 100 further includes a third transistor T3.

As shown in FIGS. 7 and 36, the first semiconductor layer 11 further includes a third active layer pattern 11B. The third active layer pattern 11B is configured to form a source and a drain of the third transistor T3.

For example, two ends of the third active layer pattern 11B are used as a source and a drain of the third transistor T3, respectively. A portion between the source and the drain is configured to form a channel under control of a gate of the third transistor T3, so as to cause the source and the drain of the third transistor T3 to be communicated.

As shown in FIGS. 8 and 36, the first gate conductive layer 12 further includes a second gate conductive pattern 12A. The second gate conductive pattern 12A is configured to form the gate of the third transistor T3.

In exemplary embodiments, as shown in FIG. 8, the first gate conductive layer 12 further includes enable signal lines M1, and the second gate conductive pattern 12A is electrically connected to an enable signal line M1. For example, as shown in FIG. 8, the second gate conductive pattern 12A and the enable signal line M1 are of an integrated structure, and a portion of the enable signal line M1 overlapping the third active layer pattern 11B is the second gate conductive pattern 12A. That is, the gate of the third transistor T3 transmits the enable signal EM.

Figure 37:
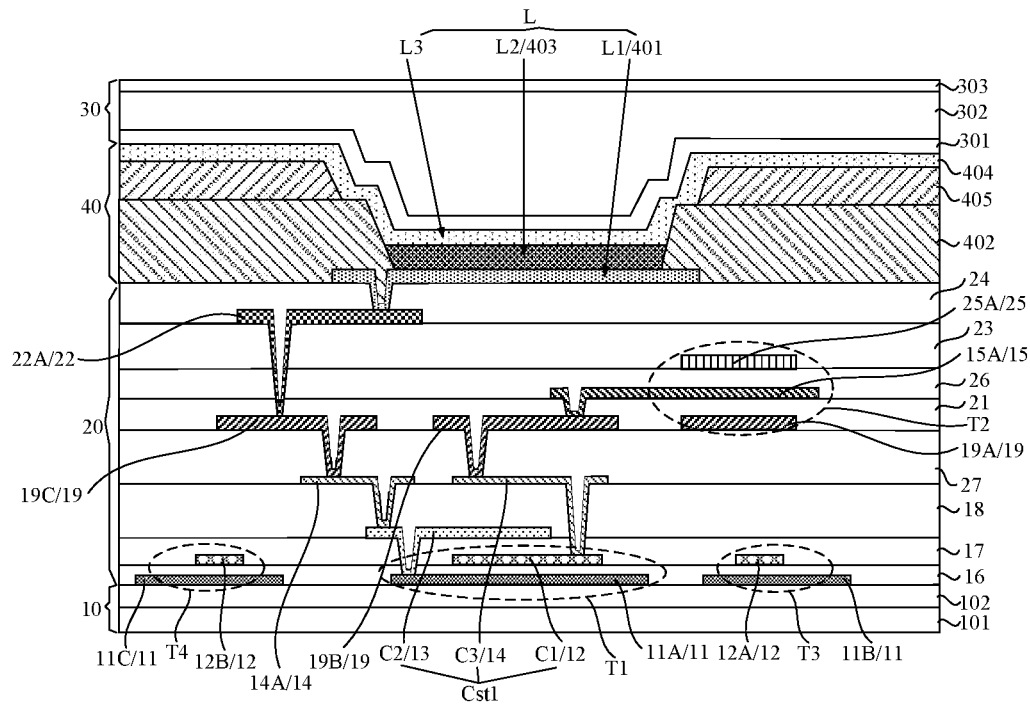
FIG. 37 is yet another sectional view taken along the section line B-B' in FIG. 2.

In some embodiments, as shown in FIG. 37, the display panel 100 further includes a fourth transistor T4.

As shown in FIGS. 7 and 37, the first semiconductor layer 11 further includes a fourth active layer pattern 11C. The fourth active layer pattern 11C is configured to form a source and a drain of the fourth transistor T4.

For example, two ends of the fourth active layer pattern 11C are used as a source and a drain of the fourth transistor T4, respectively. A portion between the source and the drain is configured to form a channel under control of a gate of the fourth transistor T4, so as to cause the source and the drain of the fourth transistor T4 to be communicated.

As shown in FIGS. 8 and 37, the first gate conductive layer 12 further includes a third gate conductive pattern 12B. The third gate conductive pattern 12B is configured to form the gate of the fourth transistor T4.

In exemplary embodiments, as shown in FIG. 8, the first gate conductive layer 12 further includes reset signal lines M2, and the third gate conductive pattern 12B is electrically connected to a reset signal line M2. For example, as shown in FIG. 8, the third gate conductive pattern 12B and the reset signal line M2 are of an integrated structure, and a portion of the reset signal line M2 overlapping the fourth active layer pattern 11C is the third gate conductive pattern 12B. That is, the gate of the fourth transistor T4 transmits the reset signal Reset.

Figure 38:
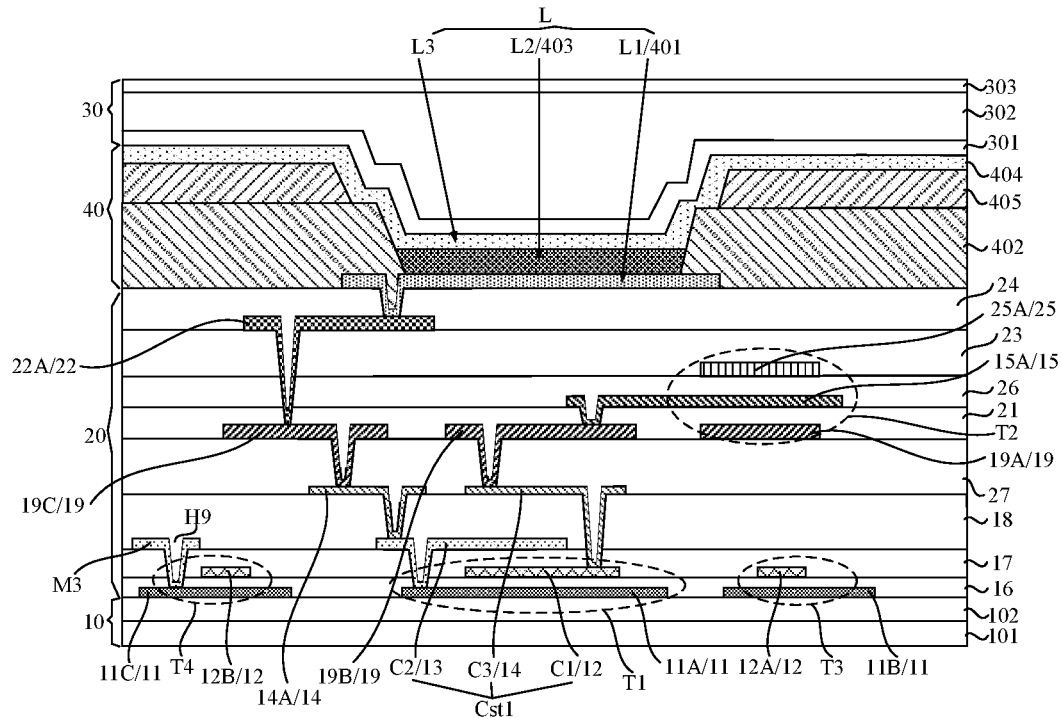
FIG. 38 is yet another sectional view taken along the section line B-B' in FIG. 2.

In some embodiments, as shown in FIG. 38, the display panel 100 further includes initialization signal lines M3 each configured to transmit an initialization signal Vinit.

As shown in FIG. 11, the initialization signal lines M3 are disposed in the second gate conductive layer 13.

As shown in FIG. 12, the initialization signal line M3 is electrically connected to the fourth active layer pattern 11C, so that the initialization signal line M3 is electrically connected to the fourth transistor T4. Therefore, the initialization signal Vinit is transmitted to the light-emitting device L under control of the gate of the fourth transistor T4.

Figure 10:
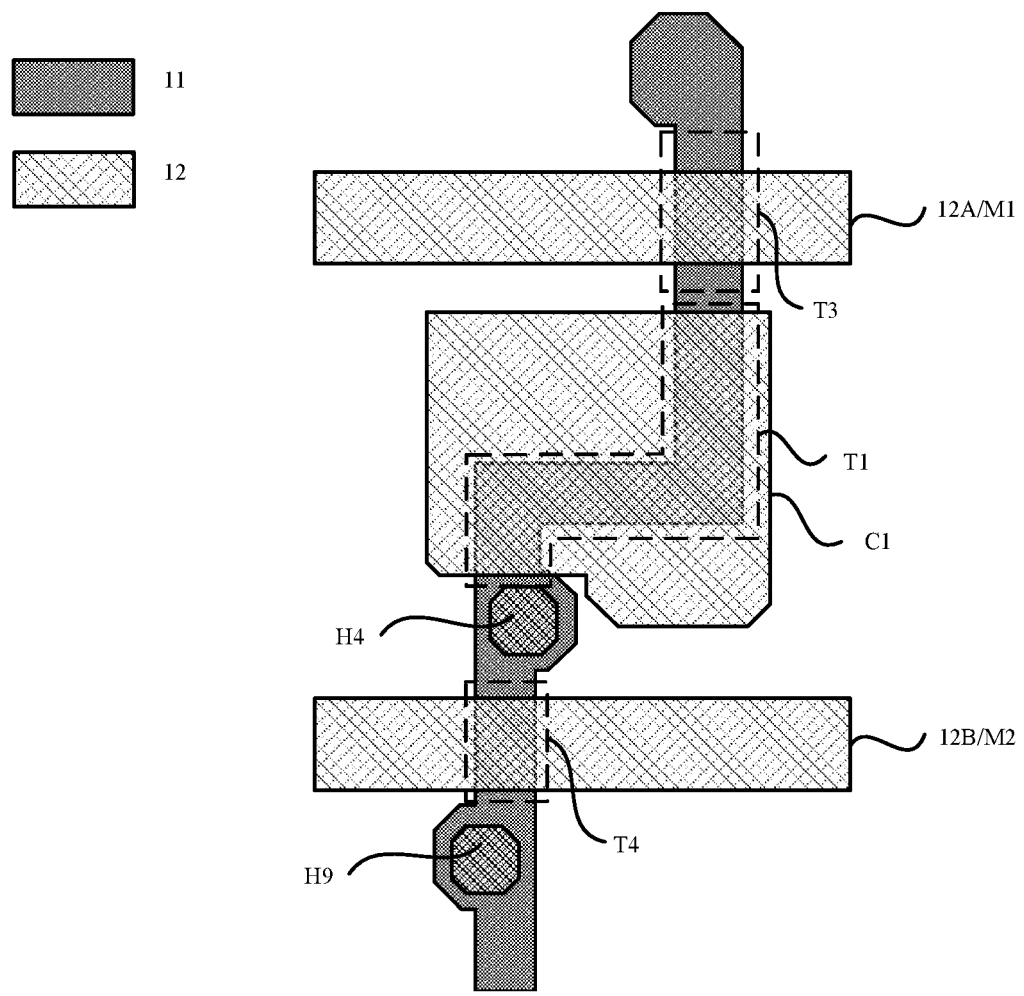
FIG. 10 is a diagram showing a structure where a first interlayer dielectric layer is stacked on a first gate conductive layer.

For example, as shown in FIGS. 10 and 38, the first interlayer dielectric layer 17 is provided with a ninth through hole H9 therein, and the initialization signal line M3 is electrically connected to the fourth active layer pattern 11C through the ninth through hole H9.

By arranging the initialization signal line M3 in the second gate conductive layer 13, the connection structure of the initialization signal line M3 and the fourth transistor T4 is simple, a connection through an excessive deep through hole is avoided, and the process difficulty is reduced. Moreover, the design space of the second gate conductive layer 13 is fully utilized, so that the planar size of the sub-pixel P (i.e., dimensions of the sub-pixel P in the direction parallel to the substrate 10) is reduced to a great extent, the pixels per inch of the display device 1000 is increased, and the resolution of the small screen display device is improved.

Figure 39:
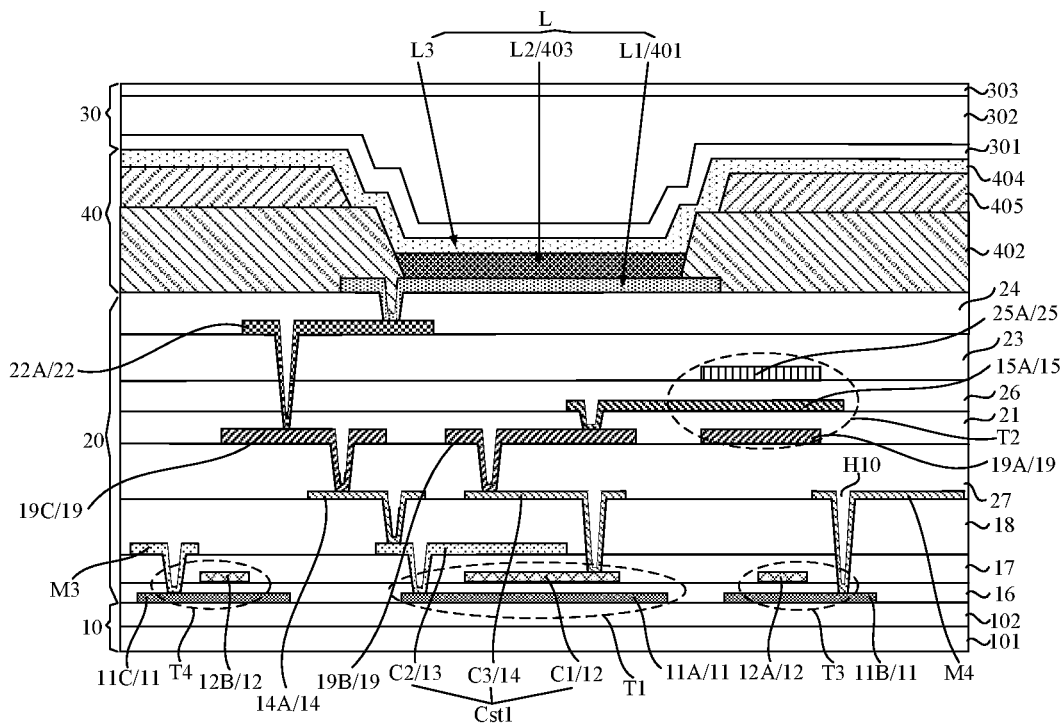
FIG. 39 is yet another sectional view taken along the section line B-B' in FIG. 2.

In some embodiments, as shown in FIG. 39, the display panel 100 further includes power supply signal lines M4 each configured to transmit a power supply voltage signal VDD.

As shown in FIG. 14, the power supply signal lines M4 are disposed in the first source-drain conductive layer 14.

As shown in FIG. 15, the power supply signal line M4 is electrically connected to the third active layer pattern 11B, so that the power supply signal line M4 is electrically connected to the third transistor T3. Therefore, the power supply voltage signal VDD is transmitted to the third node N3 under control of the gate of the third transistor T3, and is finally transmitted to the light-emitting device L through the first transistor T1 for emitting light.

For example, as shown in FIGS. 13 and 39, the second interlayer dielectric layer 18 is provided with a tenth through hole H10 therein; the tenth through hole H10 penetrates through the second interlayer dielectric layer 18, the first interlayer dielectric layer 17 and the first gate insulating layer 16 in sequence; and the power supply signal line M4 is electrically connected to the third active layer pattern 11B through the tenth through hole H10.

By arranging the power supply signal line M4 in the first source-drain conductive layer 14, the connection structure of the power supply signal line M4 and the third transistor T3 is simple, a connection through an excessive deep through hole is avoided, and the process difficulty is reduced. In addition, the design space of the first source-drain conductive layer 14 is fully utilized, so that the planar size of the sub-pixel P (i.e., the dimensions of the sub-pixel P in the direction parallel to the substrate 10) is reduced to a great extent, the pixels per inch of the display device 1000 is increased, and the resolution of the small screen display device is improved.

Figure 40:
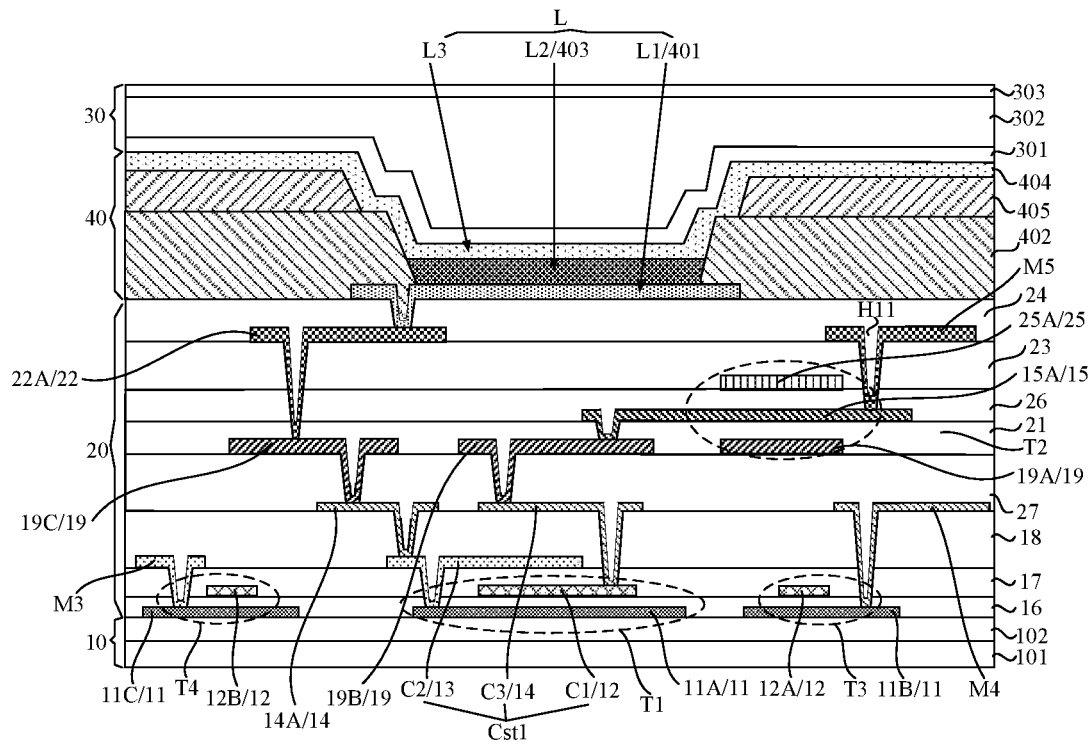
FIG. 40 is yet another sectional view taken along the section line B-B' in FIG. 2.

In some embodiments, as shown in FIG. 40, the display panel 100 further includes data signal lines M5 each configured to transmit a data signal Data and a reference signal Ref.

The reference signal Ref is configured to reset the gate of the second transistor T2. For example, the data signal Data and the reference signal Ref are alternately transmitted. The data signal Data and the reference signal Ref share a data signal line M5, so that the number of signal lines is reduced. Therefore, the planar area occupied by the sub-pixel P is reduced, the pixels per inch of the display device 1000 is increased, and the resolution of the small screen display device is improved.

As shown in FIG. 25, the data signal lines M5 are disposed in the second source-drain conductive layer 22.

As shown in FIG. 31, the data signal line M5 is electrically connected to the second active layer pattern 15A, so that the data signal line M5 is electrically connected to the second transistor T2. Therefore, the data signal Data or the reference signal Ref is transmitted to the first node N1 under control of the gate of the second transistor T2, and finally drives the gate of the first transistor T1 to be turned on.

For example, as shown in FIGS. 30 and 40, the third gate insulating layer 26 is provided with an eleventh through hole H11 therein, the eleventh through hole H11 penetrates through the third interlayer dielectric layer 23 and the third gate insulating layer 26 in sequence, and the data signal line M5 is electrically connected to the second active layer pattern 15A through the eleventh through hole H11.

By arranging the data signal line M5 in the second source-drain conductive layer 22, the connection structure of the data signal line M5 and the second transistor T2 is simple, a connection of an excessive deep through hole is avoided, and the process difficulty is reduced. Moreover, the design space of the second source-drain conductive layer 22 is fully utilized, so that the planar size of the sub-pixel P (i.e., the dimensions of the sub-pixel P in the direction parallel to the substrate 10) is reduced to a great extent, the pixels per inch of the display device 1000 is increased, and the resolution of the small screen display device is improved.

In addition, in a case where the second semiconductor layer 15 is made of an oxide semiconductor material, writing the data signal Data into the second transistor T2 may reduce leakage, which avoids a problem of large leakage and poor signal transmission uniformity, and thus the display effect of the display device 1000 is well improved.

In some embodiments, as shown in FIG. 20, the third gate conductive layer 19 further includes first scan signal lines M6.

A first scan signal line M6 is electrically connected to the first gate conductive pattern 19A. For example, as shown in FIG. 20, the first scan signal line M6 and the first gate conductive pattern 19A are of an integrated structure, and a portion of the first scan signal line M6 overlapping the second active layer pattern 15A is the first gate conductive pattern 19A. That is, the first gate of the second transistor T2 transmits the scan signal Scan.

In exemplary embodiments, an orthographic projection of the first scan signal line M6 on the substrate 10 at least partially overlaps with an orthographic projection of the enable signal line M1 on the substrate 10. The signal lines located in different film layers overlap in the direction perpendicular to the substrate 10, which may reduce the design space occupied by the signal lines in the direction parallel to the substrate 10 without affecting the light-emitting function of the sub-pixel P. Therefore, the planar space occupied by the sub-pixel P is further reduced, the pixels per inch of the display device 1000 is increased, and the resolution of the small screen display device is improved.

In some embodiments, as shown in FIG. 28, the fourth gate conductive layer 25 further includes second scan signal lines M7.

A second scan signal line M7 is electrically connected to the fourth gate conductive pattern 25A. For example, as shown in FIG. 20, the second scan signal line M7 and the fourth gate conductive pattern 25A are of an integrated structure, and a portion of the second scan signal line M7 overlapping the second active layer pattern 15A is the fourth gate conductive pattern 25A. That is, the second gate of the second transistor T2 transmits the scan signal Scan.

For example, the first scan signal line M6 and the second scan signal line M7 transmit the same scan signal Scan.

In exemplary embodiments, an orthographic projection of the second scan signal line M7 on the substrate 10 at least partially overlaps with the orthographic projection of the first scan signal line M6 on the substrate 10. The signal lines located in different film layers overlap in the direction perpendicular to the substrate 10, which may reduce the design space occupied by the signal lines in the direction parallel to the substrate 10 without affecting the light-emitting function of the sub-pixel P. Therefore, the planar space occupied by the sub-pixel P is further reduced, the pixels per inch of the display device 1000 is increased, and the resolution of the small screen display device is improved.

For example, orthographic projections of the first scan signal line M6, the second scan signal line M7, and the enable signal line M1 on the substrate 10 overlap. In some embodiments, as shown in FIG. 23, the orthographic projection of the first capacitor electrode plate C1 on the substrate 10 at least partially overlaps with the orthographic projection of the second active layer pattern 15A on the substrate 10. That is, the design space occupied by the second transistor T2 in the direction parallel to the substrate 10 and the design space occupied by the first transistor T1 in the direction parallel to the substrate 10 overlap in the direction perpendicular to the substrate 10. Therefore, the design space of one thin film transistor T may be saved in the direction parallel to the substrate 10, and the dimensions of the sub-pixel P in the direction parallel to the substrate 10 may be reduced. As a result, the pixels per inch of the display device 1000 may be increased, and the resolution of the small screen display device is improved.

In some embodiments, the display panel 100 further includes at least one buffer layer 28 disposed between the first source-drain conductive layer 14 and the second semiconductor layer 15.

Figure 41:
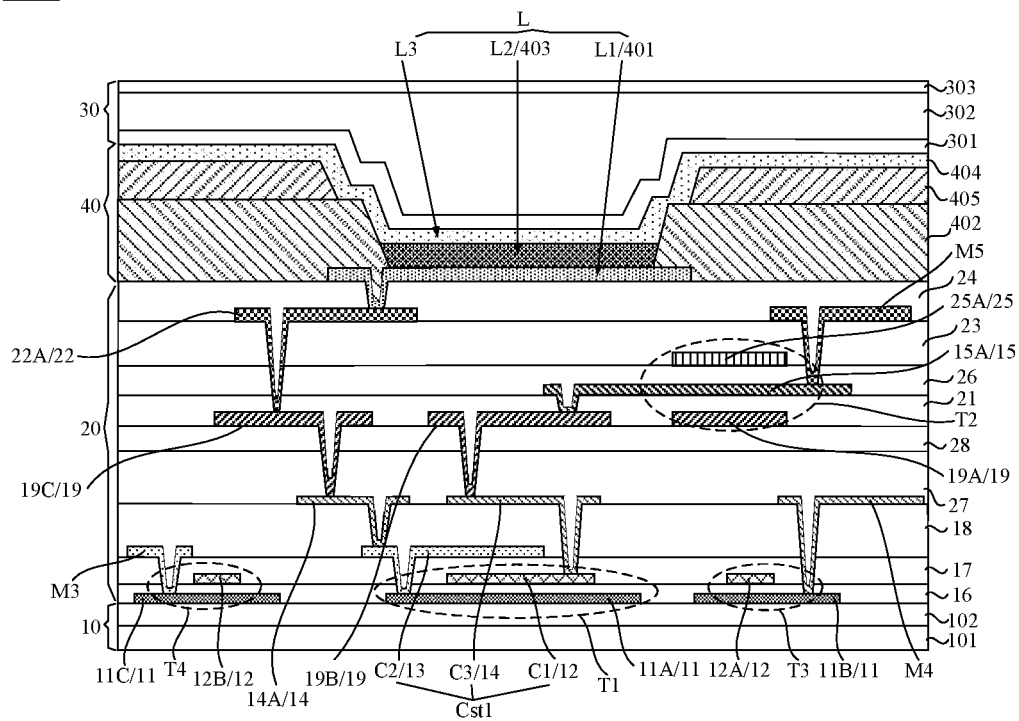
FIG. 41 is yet another sectional view taken along the section line B-B' in FIG. 2.

For example, as shown in FIG. 41, the buffer layer 28 is disposed between the first planarization layer 27 and the third gate conductive layer 19.

By arranging the buffer layer 28 between the first source-drain conductive layer 14 and the second semiconductor layer 15, in an aspect, the buffer layer 28 is used as a base of the second transistor T2, which facilitates the manufacture of the second transistor T2; in another aspect, the buffer layer 28 separates the second transistor T2 from a thin film transistor T (e.g., the first transistor T1) in a lower layer, thereby reducing influence of crosstalk between overlapping thin film transistors T; in yet another aspect, the damage to the thin film transistor T (e.g., the first transistor T1) in the lower layer in the process of forming the second transistor T2 is avoided.

Figure 42:
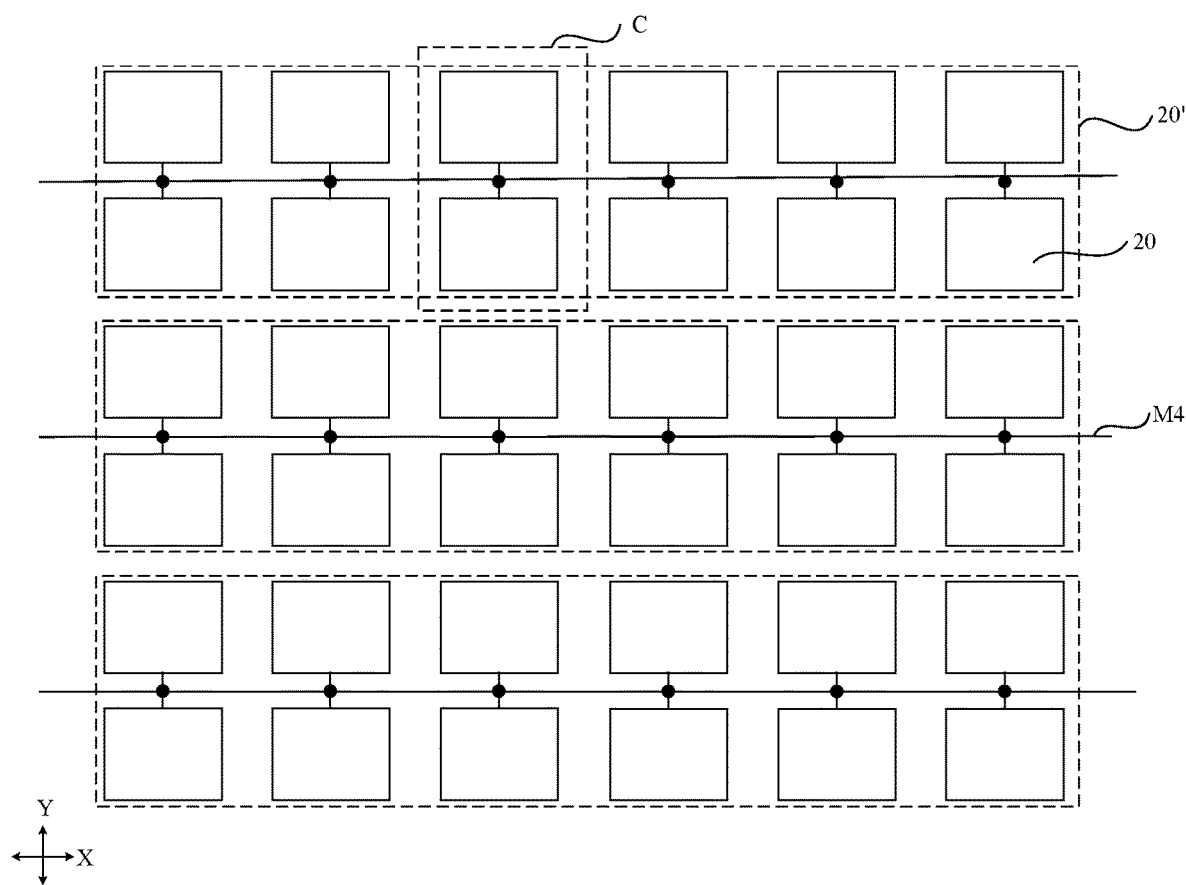
FIG. 42 is a top view of a pixel circuit, in accordance with some embodiments.

In some embodiments, as shown in FIG. 42, the display panel 100 includes a plurality of pixel circuits 20 arranged in a plurality of rows along a first direction X, the plurality of pixel circuits 20 are divided into a plurality of pixel circuit groups 20', and each pixel circuit group 20' includes two rows of pixel circuits 20 that are adjacent in a second direction Y.

The first direction X and the second direction Y intersect. For example, the first direction X and the second direction Y may be perpendicular to each other.

It should be noted that the first direction X may be a horizontal direction of the display device 1000, and the second direction Y may be a vertical direction of the display device 1000; or the first direction X may be a row direction in which the sub-pixels P of the display device 1000 are arranged, and the second direction Y may be a column direction in which the sub-pixels P of the display device 1000 are arranged.

In the drawings of the present disclosure are illustrated only by taking an example in which the first direction X is the row direction, and the second direction Y is the column direction. In the present disclosure, technical solutions obtained by rotating the drawings at 90 degrees shall also be within the protection scope of the present disclosure.

The power supply signal lines M4 extend along the first direction X, a power supply signal line M4 is disposed between the two rows of pixel circuits 20 of the pixel circuit group 20', and the two rows of pixel circuits 20 of the pixel circuit group 20' are electrically connected to the power supply signal line M4. That is, two rows of pixel circuits 20 of the same pixel circuit group 20' share one power supply signal line M4.

Figure 43:
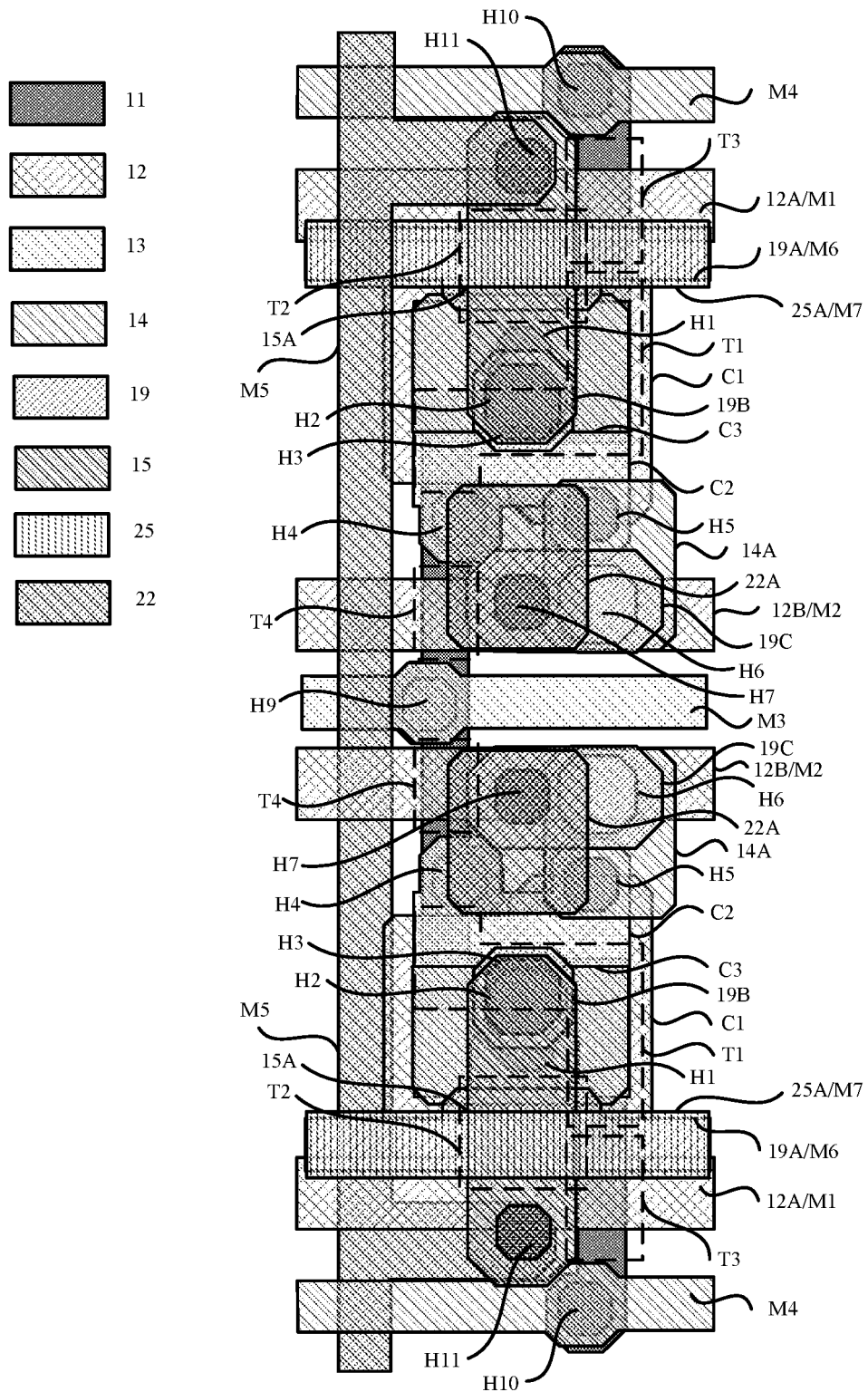
FIG. 43 is a structural diagram of a region where the dashed box C in FIG. 42 is located.

In exemplary embodiments, as shown in FIG. 43, two adjacent pixel circuits 20, in the second direction Y, of the two rows of pixel circuits 20 of the pixel circuit group 20' are arranged in mirror symmetry with respect to the power supply signal line M4 as a symmetry axis.

Since two rows of pixel circuits 20 share a single power supply signal line M4, the design space occupied by a single power supply signal line M4 may be saved. Therefore, the dimensions of the sub-pixel P in the direction parallel to the substrate 10 is further reduced, the pixels per inch of the display device 1000 is increased, and the resolution of the small screen display device is improved.

Figure 44:
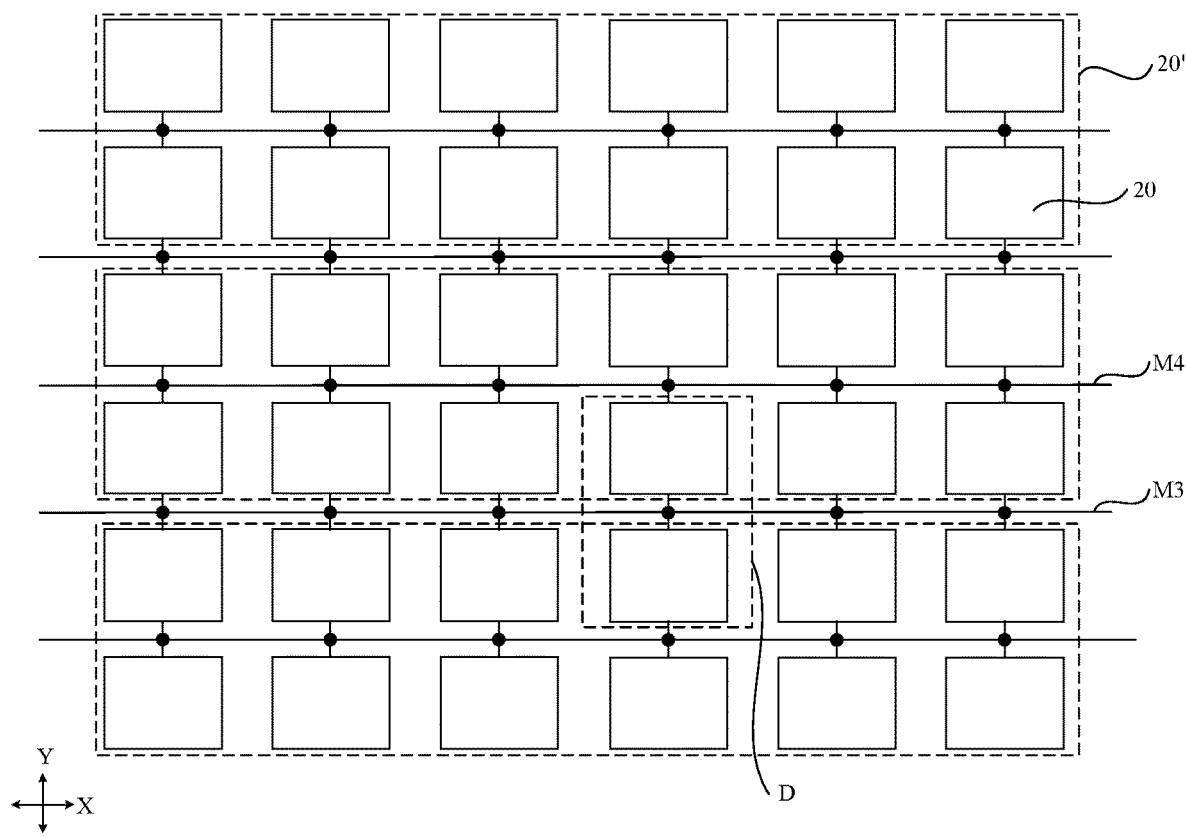
FIG. 44 is a top view of another pixel circuit, in accordance with some embodiments.

In some embodiments, as shown in FIG. 44, the display panel 100 includes a plurality of pixel circuits 20 arranged in a plurality of rows along the first direction X, the plurality of pixel circuits 20 are divided into a plurality of pixel circuit groups 20', and each pixel circuit group 20' includes two rows of pixel circuits 20 that are adjacent in the second direction Y.

The initialization signal lines M3 extend along the first direction X, an initialization signal line M3 is disposed between two adjacent pixel circuit groups 20', and two rows of pixel circuits 20, adjacent to the initialization signal line M3, of the two adjacent pixel circuit groups 20' are electrically connected to the initialization signal line M3. That is, in the two adjacent groups of pixel circuit groups 20', the two rows of pixel circuits 20 adjacent to the initialization signal line M3 share one initialization signal line M3.

Figure 45:
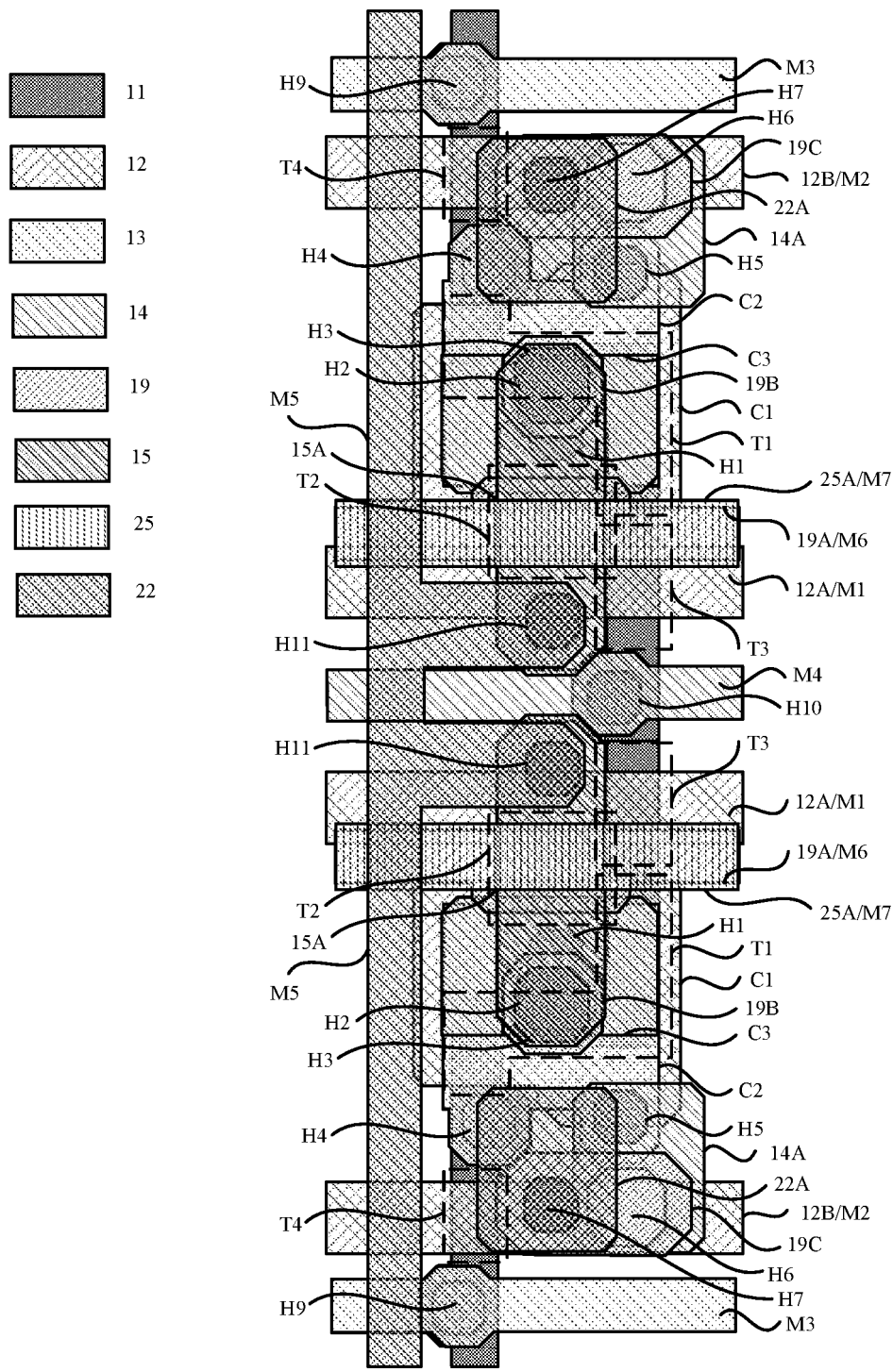
FIG. 45 is a structural diagram of a region where the dashed box D in FIG. 44 is located.

In exemplary embodiments, as shown in FIG. 45, in the two rows of pixel circuits 20 electrically connected to the initialization signal line M3, two adjacent pixel circuits 20 in the second direction Y are arranged in mirror symmetry with respect to the initialization signal line M3 as a symmetry axis.

Since two rows of pixel circuits 20 share a single initialization signal line M3, the design space occupied by a single initialization signal line M3 may be saved. Therefore, the dimensions of the sub-pixel P in the direction parallel to the substrate 10 is further reduced, the pixels per inch of the display device 1000 is increased, and the resolution of the small screen display device is improved.

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising a pixel circuit, wherein the pixel circuit includes a first transistor, a storage capacitor, and a second transistor;
   the display panel comprises: a substrate, and a first semiconductor layer, a first gate conductive layer, a second gate conductive layer, a first source-drain conductive layer and a second semiconductor layer that are arranged in a stack on the substrate in a direction away from the substrate;
   wherein the first semiconductor layer includes a first active layer pattern, the first gate conductive layer includes a first capacitor electrode plate, the second gate conductive layer includes a second capacitor electrode plate, the first source-drain conductive layer includes a third capacitor electrode plate, and the second semiconductor layer includes a second active layer pattern;
   wherein the first active layer pattern and the first capacitor electrode plate are configured to form a source, a drain and a gate of the first transistor, and the second active layer pattern is configured to form a source and a drain of the second transistor;
   each of an orthographic projection of the first capacitor electrode plate on the substrate and an orthographic projection of the third capacitor electrode plate on the substrate at least overlaps with an orthographic projection of the second capacitor electrode plate on the substrate; the first capacitor electrode plate is electrically connected to the third capacitor electrode plate; and the first capacitor electrode plate, the second capacitor electrode plate and the third capacitor electrode plate constitute the storage capacitor.

2. The display panel according to claim 1, wherein the second active layer pattern is electrically connected to the third capacitor electrode plate.

3. The display panel according to claim 1, further comprising:
   a third gate conductive layer disposed between the first source-drain conductive layer and the second semiconductor layer, wherein
   the third gate conductive layer includes:
      a first gate conductive pattern configured to form a first gate of the second transistor; and
      a first connection pattern, wherein the second active layer pattern is electrically connected to the third capacitor electrode plate through the first connection pattern.

4. The display panel according to claim 3, further comprising:
   a first interlayer dielectric layer disposed between the first gate conductive layer and the second gate conductive layer;
   a second interlayer dielectric layer disposed between the second gate conductive layer and the first source-drain conductive layer;
   a first planarization layer disposed between the first source-drain conductive layer and the third gate conductive layer; and
   a second gate insulating layer disposed between the third gate conductive layer and the second semiconductor layer;
   wherein the display panel is provided therein with a first through hole, a second through hole and a third through hole; the first through hole penetrates through the first interlayer dielectric layer and the second interlayer dielectric layer, and the third capacitor electrode plate is electrically connected to the first capacitor electrode plate through the first through hole; the second through hole penetrates through the first planarization layer, and the first connection pattern is electrically connected to the third capacitor electrode plate through the second through hole; and the third through hole penetrates through the second gate insulating layer, and the second active layer pattern is electrically connected to the first connection pattern through the third through hole.

5. The display panel according to claim 4, wherein orthogonal projections of at least two of the first through hole, the second through hole, and the third through hole on the substrate at least partially overlap.

6. The display panel according to claim 1, further comprising:
   a second source-drain conductive layer disposed on a side of the second semiconductor layer away from the substrate, wherein the second source-drain conductive layer includes a second connection pattern; and a first electrode layer disposed on a side of the second source-drain conductive layer away from the substrate, wherein the first electrode layer includes a first electrode, and the first electrode is electrically connected to the second connection pattern;

wherein the first source-drain conductive layer further includes a third connection pattern, and the third connection pattern is electrically connected to the second connection pattern and the second capacitor electrode plate.

7. The display panel according to claim 6, wherein the display panel further comprises a third gate conductive layer disposed between the first source-drain conductive layer and the second semiconductor layer;

wherein the third gate conductive layer includes a fourth connection pattern, and the third connection pattern is electrically connected to the second connection pattern through the fourth connection pattern.

8. The display panel according to claim 7, further comprising:

a first gate insulating layer disposed between the first semiconductor layer and the first gate conductive layer;

a first interlayer dielectric layer disposed between the first gate conductive layer and the second gate conductive layer;

a second interlayer dielectric layer disposed between the second gate conductive layer and the first source-drain conductive layer;

a first planarization layer disposed between the first source-drain conductive layer and the third gate conductive layer;

a second gate insulating layer disposed between the third gate conductive layer and the second semiconductor layer;

a third interlayer dielectric layer disposed between the second semiconductor layer and the second source-drain conductive layer; and a second planarization layer disposed between the second source-drain conductive layer and the first electrode layer;

wherein the display panel is provided therein with a fourth through hole, a fifth through hole, a sixth through hole, a seventh through hole and an eighth through hole;

the fourth through hole penetrates through the first gate insulating layer and the first interlayer dielectric layer, and the second capacitor electrode plate is electrically connected to the first active layer pattern through the fourth through hole; the fifth through hole penetrates through the second interlayer dielectric layer, and the third connection pattern is electrically connected to the second capacitor electrode plate through the fifth through hole; the sixth through hole penetrates through the first planarization layer, and the fourth connection pattern is electrically connected to the third connection pattern through the sixth through hole; the seventh through hole penetrates through the second gate insulating layer and the third interlayer dielectric layer, and the second connection pattern is electrically connected to the fourth connection pattern through the seventh through hole; and the eighth through hole penetrates through the second planarization layer, and the first electrode is electrically connected to the second connection pattern through the eighth through hole.

9. The display panel according to claim 8, wherein orthogonal projections of at least two of the fourth through hole, the fifth through hole, the sixth through hole, the seventh through hole, and the eighth through hole on the substrate at least partially overlap.

10. The display panel according to claim 6, wherein the second source-drain conductive layer further includes data signal lines; a data signal line is configured to transmit a data signal and a reference signal; the reference signal is configured to reset a gate of the first transistor; and the data signal line is electrically connected to the second active layer pattern.

11. The display panel according to claim 1, wherein the pixel circuit further includes a third transistor;

the first semiconductor layer further includes a third active layer pattern, the first gate conductive layer further includes a second gate conductive pattern, and the third active layer pattern and the second gate conductive pattern are configured to form a source, a drain and a gate of the third transistor;

the first source-drain conductive layer further includes power supply signal lines, and a power supply signal line is electrically connected to the third active layer pattern.

12. The display panel according to claim 11, wherein the display panel comprises a plurality of pixel circuits arranged in a plurality of rows along a first direction, the plurality of pixel circuits are divided into a plurality of pixel circuit groups, each pixel circuit group includes adjacent two rows of pixel circuits in a second direction, and the first direction and the second direction intersect;

the power supply signal lines extend along the first direction, a power supply signal line is disposed between the two rows of pixel circuits of the pixel circuit group, and the two rows of pixel circuits of the pixel circuit group are electrically connected to the power supply signal line.

13. The display panel according to claim 12, wherein in the two rows of pixel circuits of the pixel circuit group, two adjacent pixel circuits in the second direction are arranged in mirror symmetry with respect to the power supply signal line as a symmetry axis.

14. The display panel according to claim 1, wherein the pixel circuit further includes a fourth transistor;

the first semiconductor layer further includes a fourth active layer pattern, the first gate conductive layer further includes a third gate conductive pattern, and the fourth active layer pattern and the third gate conductive layer are configured to form a source, a drain and a gate of the fourth transistor;

the second gate conductive layer further includes initialization signal lines, and an initialization signal line is electrically connected to the fourth active layer pattern.

15. The display panel according to claim 14, wherein the display panel comprises a plurality of pixel circuits arranged in a plurality of rows along a first direction, the plurality of pixel circuits are divided into a plurality of pixel circuit groups, each pixel circuit group includes adjacent two rows of pixel circuits in a second direction, and the first direction and the second direction intersect;

the initialization signal lines extend along the first direction, an initialization signal line is disposed between two adjacent pixel circuit groups, and two rows of pixel circuits adjacent to the initialization signal line in the two adjacent pixel circuit groups are electrically connected to the initialization signal line.

16. The display panel according to claim 15, wherein in the two rows of pixel circuits electrically connected to the initialization signal line, two adjacent pixel circuits in the second direction are arranged in mirror symmetry with respect to the initialization signal line as a symmetry axis.

17. The display panel according to claim 1, wherein the pixel circuit further includes a third transistor;
the first gate conductive layer includes a second gate conductive pattern and enable signal lines, the second gate conductive pattern is configured to form a gate of the third transistor, and an enable signal line is electrically connected to the second gate conductive pattern;
the display panel further comprises a third gate conductive layer disposed between the first source-drain conductive layer and the second semiconductor layer, the third gate conductive layer includes a first gate conductive pattern and first scan signal lines, the first gate conductive pattern is configured to form a first gate of the second transistor, and a first scan signal line is electrically connected to the first gate conductive pattern;
wherein an orthographic projection of the enable signal line on the substrate at least partially overlaps with an orthographic projection of the first scan signal line on the substrate.

18. The display panel according to claim 17, further comprising:
a fourth gate conductive layer disposed on a side of the second semiconductor layer away from the substrate;
the fourth gate conductive layer includes:
a fourth gate conductive pattern configured to form a second gate of the second transistor, wherein an orthographic projection of the fourth gate conductive pattern on the substrate at least partially overlaps with an orthographic projection of the first gate conductive pattern on the substrate; and
second scan signal lines, wherein a second scan signal line is electrically connected to the fourth gate conductive pattern, and an orthographic projection of the second scan signal line on the substrate at least partially overlaps with the orthographic projection of the first scan signal line on the substrate.

19. The display panel according to claim 1, wherein an orthographic projection of the first capacitor electrode plate on the substrate at least partially overlaps with an orthographic projection of the second active layer pattern on the substrate; and/or
the display panel further comprises at least one buffer layer disposed between the first source-drain conductive layer and the second semiconductor layer.

20. A display device, comprising the display panel according to claim 1.

* * * * *